(12) United States Patent
Gotkis

(10) Patent No.: US 8,206,508 B2
(45) Date of Patent: Jun. 26, 2012

(54) WET SURFACE TREATMENT BY USAGE OF A LIQUID BATH CONTAINING ENERGY LIMITED BUBBLES

(76) Inventor: Yehiel Gotkis, Fremont, CA (US)

( * ) Notice: Subject to any disclaimer, the term of this patent is extended or adjusted under 35 U.S.C. 154(b) by 806 days.

(21) Appl. No.: 12/027,724

(22) Filed: Feb. 7, 2008

(65) Prior Publication Data

US 2008/0190459 A1   Aug. 14, 2008

Related U.S. Application Data

(60) Provisional application No. 60/900,857, filed on Feb. 12, 2007.

(51) Int. Cl.
*B08B 3/00* (2006.01)
(52) U.S. Cl. .................................. 134/1.3; 134/34
(58) Field of Classification Search .................. None
See application file for complete search history.

(56) References Cited

U.S. PATENT DOCUMENTS

| 5,681,397 A * | 10/1997 | Li | 134/2 |
| 2005/0009349 A1 * | 1/2005 | Kassir | 438/689 |
| 2006/0182664 A1 * | 8/2006 | Peck et al. | 422/102 |

* cited by examiner

*Primary Examiner* — Michael Kornakov
*Assistant Examiner* — Nicole Blan
(74) *Attorney, Agent, or Firm* — Gideon Gimlan

(57) ABSTRACT

A method controllably and sustainably creates an upwardly directed gradient of dropping temperatures in a wet treatment tank between a cooled and face down workpiece (e.g., an in-process semiconductor wafer) and a lower down heat source. A thermal fluid upwell containing thermally collapsible bubbles is then directed from the heat source to the face down workpiece. In one class of embodiments, bubble collapse energy release and/or bubble collapse locations are controlled so as to avoid exposing delicate features of the to-be-treated surface to damaging forces. In one class of embodiments the wet treatment includes ultra-cleaning of the work face. Cleaning fluids that are essentially free of predefined contaminates are upwelled to the to-be-cleaned surface and potentially contaminated after-flows are convectively directed away from the workpiece so as to prevent recontamination of the workpiece.

22 Claims, 5 Drawing Sheets

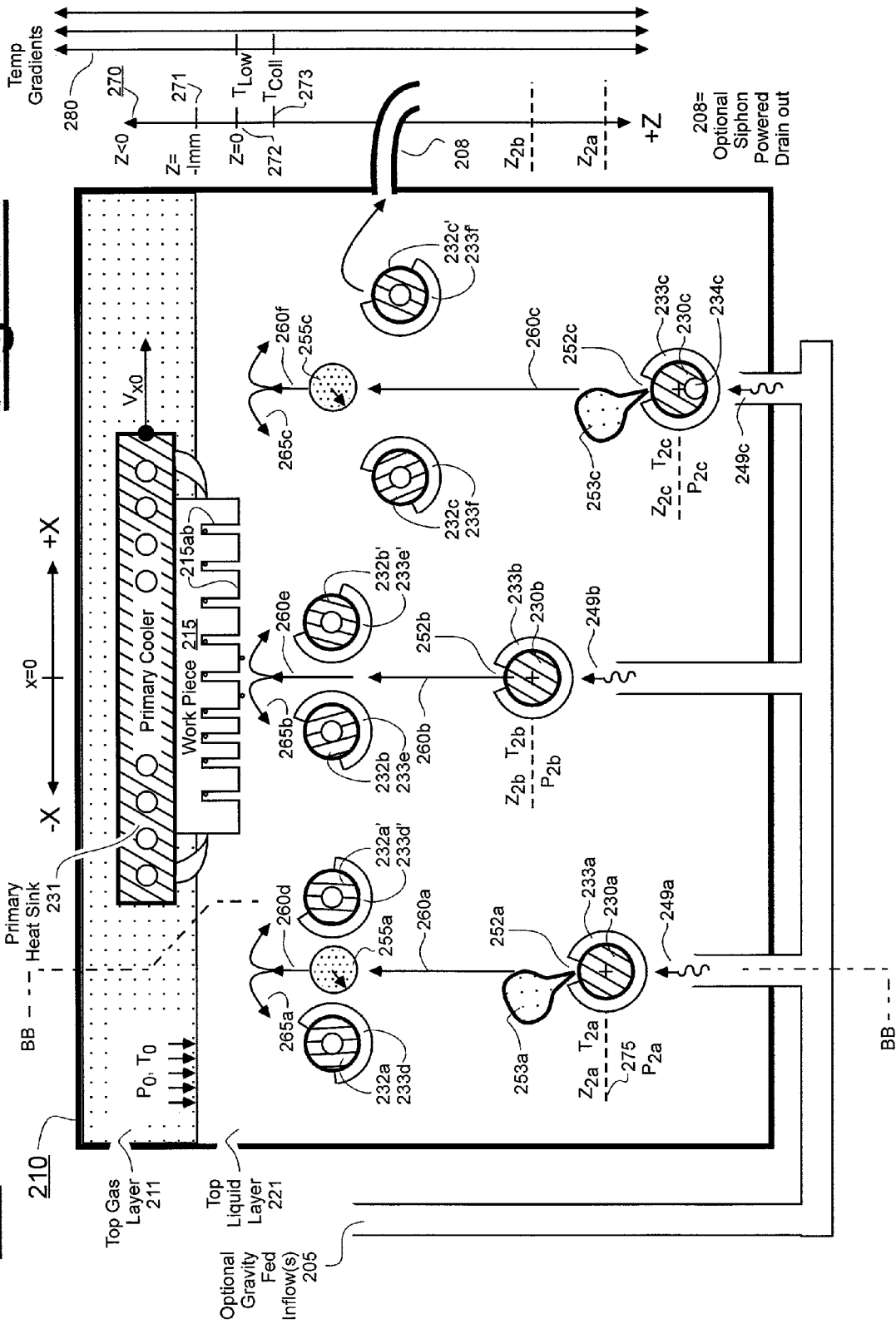

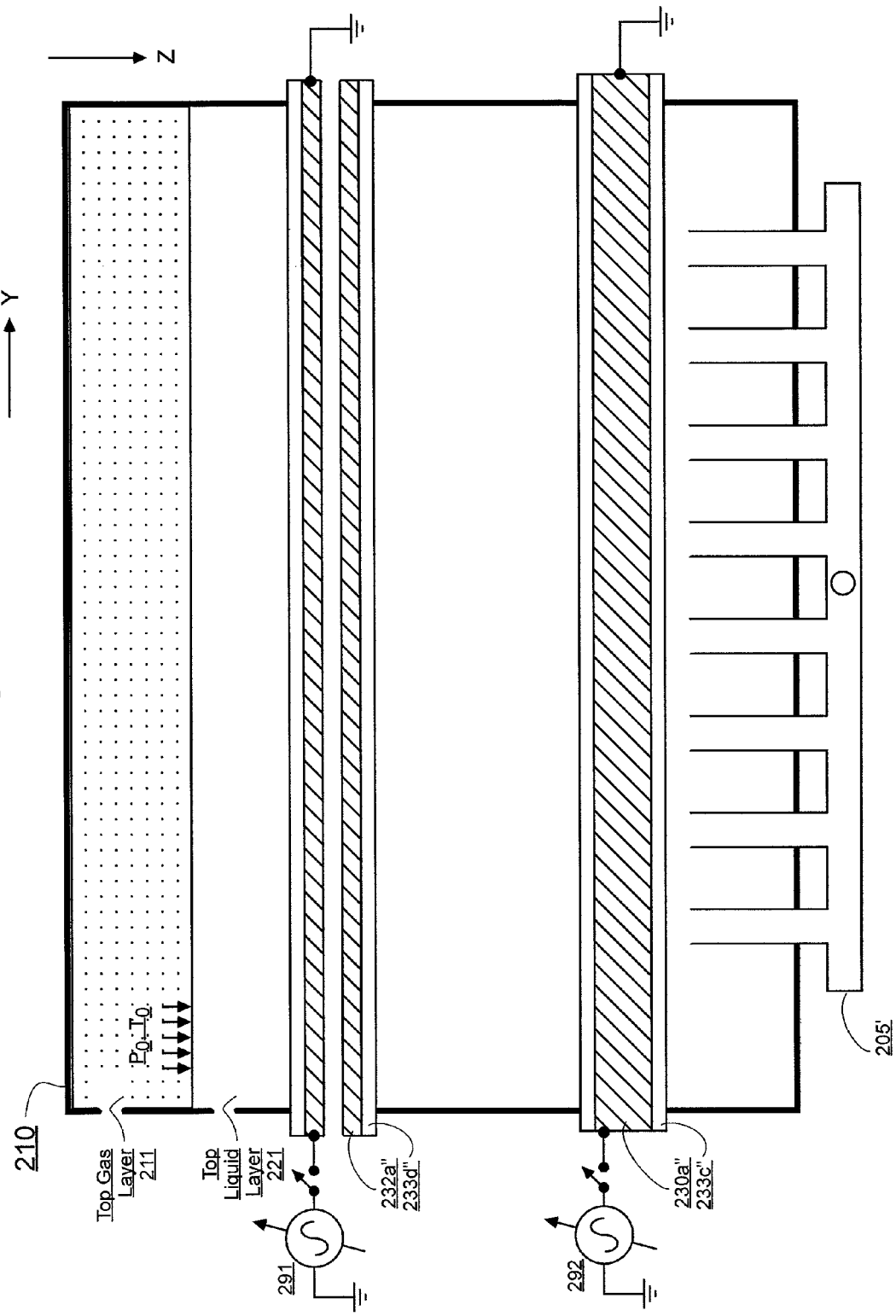

WET SURFACE TREATMENT BY USAGE OF A LIQUID BATH CONTAINING ENERGY LIMITED BUBBLES

CROSS REFERENCE TO CO-OWNED APPLICATION

The following copending U.S. provisional patent application is owned by the owner of the present application, its teachings of inventive concepts are incorporated herein by reference and benefit of its filing date is claimed to the extent allowed by law:

(A) U.S. Provisional Ser. No. 60/900,857 filed Feb. 12, 2007 by Yehiel Gotkis and originally entitled, Method and Apparatus for Wafer Cleaning and Drying.

(In incorporating the written description teachings of said U.S. Provisional Ser. No. 60/900,857, Applicant is not here adopting or reiterating any statements made in 60/900,857 that might constitute admissions against interest regarding what might constitute the pertinent art, what might constitute the scope and content of applicable prior art or about scope of claimable invention. Applicant is however incorporating all proofs of early conception of inventive subject matter disclosed in 60/900,857.)

FIELD OF DISCLOSURE

The present disclosure of invention relates generally to wet treatments of delicate surfaces where such surfaces can be permanently or temporarily damaged by application of forces of excessive magnitude and/or by application of solutions that contain excessive quantities of undesired materials. Such wet treatments may include selective removal of unwanted particulate matter or unwanted impurities from a surface of a workpiece; a process that is sometimes referred to as surface preparation or surface cleaning. The disclosure relates more specifically to cleaning of workpieces having fine or delicate surface features such as may be found in-process semiconductor wafers.

DESCRIPTION OF RELATED TECHNOLOGY

Each time an in-process semiconductor wafer is subjected to a fabrication operation, be it a surface planarization operation (e.g., chemical mechanical planarization a.k.a. CMP), or development of a photolithographically patterned mask layer (e.g., UV hardening of finely patterned organic photoresist a.k.a. PR), or selective etching (e.g., metal etch) or another such fabrication step, unwanted particulate matter and/or unwanted impurities may be left behind on the worked-on wafer, be it on a last-operated on surface (work face) of the wafer, or on a backside of the wafer, or on its beveled edge or on various combinations of these surfaces. It is generally desirable at the end of each fabrication step to selectively remove as much of this unwanted particulate matter and/or impurities as practical from at least one surface while leaving intact other materials and/or patterns that were desirably formed on one or more of the post-process surfaces of the wafer. Generally the selective removal process is referred to as cleaning and/or surface preparation. Selective removal of the unwanted matter to an extremely high degree of cleanliness or purity may be referred to as ultracleaning or ultra-preparation. Simple as they may sound, cleaning, ultracleaning and surface preparation are complex subject areas with many unique nuances that are best appreciated by those skilled in the wafer cleaning, ultracleaning and surface preparation arts.

There are many different types of surface preparation and/or cleaning operations including dry and wet. The ones of relevance here are the wet treatment techniques. These entail a subjecting of the post-process wafer surface to one or more treatment liquids such as cleaning or purifying liquids. The wet treatment may occur with or without the presence of mechanical agitation and/or with or without injection of various types of propagated wave energies (e.g., sonic wave energy) into the wet treatment system.

Over recent times, so-called critical dimensions of features intentionally formed on in-process wafers have continued to shrink to smaller and smaller values (e.g., to deep sub-100 nm diameter contact holes, pitched interconnect lines and the like). For example, current technology roadmaps are looking to implement transistors with channel lengths of 32 nm or smaller. Current technology and particular industry roadmaps are looking to implement narrow trenches with aspect ratios as high as 20:1, 40:1, and targeting even 80:1 or higher, this being another example of the trend towards mass production of devices with features that are more challenging in terms of post-process cleaning or other surface preparation. As a result of such shrinkages and/or trends toward extremely asymmetric feature geometries, the on-wafer features that need to be preserved throughout the surface preparation, surface cleaning and/or ultracleaning processes have become more fragile, more susceptible to damage and more prone to having unwanted debris, unwanted impurities or unwanted other matter trapped in difficult to reach recesses. Fragility of thin surface films and/or of ultra-fine surface patterns (e.g., delicate PR patterns) is a growing problem, particularly as the fragile surface features are subjected to cleaning/purifying liquids in combination with physical agitations or other applied energies (e.g., ultrasonic energy) that are poorly controlled and thus can become excessive.

At the same time that modern device surfaces are becoming finer and more fragile, the need grows for ever greater degrees of surface cleanliness and/or surface purity after each processing step. This confluence of trends presents new challenges that artisans in the surface treatment and cleaning fields have not previously encountered.

In terms of more specifics, there is one form of previously used wet cleaning that is referred to as Megasonics. In Megasonics, sonic waves having frequencies of about 1 Megahertz (MHz) or above and having relatively large wave amplitudes are induced in the cleaning liquid near the to-be-cleaned surface (e.g., post-patterning surface) of a wafer. The basic hope of Megasonics is that its high frequency agitations will assist in breaking or weakening bonds that link unwanted particulate matter (e.g., debris) to the to-be-cleaned wafer surface. However, a variety of uncontrolled wave interference and wave reinforcement patterns tend to develop at the wafer surface during use of Megasonic cleaning. Without wishing to be bound to any specific theory, it is believed that these uncontrolled interfering and/or reinforcing ultrasonic wave patterns tend to create so called, pressure hot-spots at which excessive forces or temperatures build up to potentially damage or deform (e.g., collapse) the delicate films and/or fine patterns that are generally intended to be left behind and intact on the wafer work surface after the surface preparation, cleaning and/or ultracleaning processes complete. As a result of such potentially damaging or deforming mechanisms, popular cleaning techniques such as Megasonics can cause production yields to disadvantageously deteriorate when applied to finely pitched patterns and/or ultra-thin surface films such as may be found on in-process silicon or other semiconductor wafers during mass production. A new alternative is needed, particularly in light of shrinking feature sizes and use of delicate or fragile materials for defining work surface features.

SUMMARY

In accordance with the present disclosure of invention, a supplied workpiece that has a delicate surface is subjected to a wet treatment bath that contains in-liquid bubbles whose sizes and internal pressures are limited to predefined per-bubble volume and pressure limits and thus to limited per-bubble energies. As a result of the generally-enforced per-bubble volume and pressure limits, no single, within-expectations bubble among a plurality of such bubbles can subject its respective portion of the workpiece surface to forces (or energies) that can permanently or temporarily damage the delicate surface features of that surface locality, provided of course that the local surface delicacy is within predefined manufacturing tolerances (in other words, not so abnormally delicate that even within-expectation bubbles can damage the out-of-tolerance surface locality).

In accordance with the present disclosure, the energetically-constrained bubbles can be of one or more of the following at least three types of in-liquid bubbles, although these categories may overlap with one another and there may be others: (a) thermally collapsible bubbles; (b) reactive-chemical delivering bubbles; and (c) not-fully-collapsible surface sweeping bubbles.

A thermally collapsible bubble is one whose internal pressure can be made to drop rapidly to a magnitude that is about 5 times less or even smaller (e.g., about 10× less or even smaller) than an external hydrostatic pressure surrounding the bubble, where this rapid drop of internal pressure occurs due to the temperature of liquid surrounding the bubble being reduced to a critical temperature or below that critical temperature (e.g., below a boiling point of a predefined vapor present inside the thermally collapsible bubble). A thermally collapsible bubble generally contains a vapor that rapidly condenses as temperature around the bubble drops to or below the boiling point temperature (B.P.) of that vapor material, where the B.P. is for the given pressure condition inside the bubble. A thermally collapsible bubble may additionally or alternatively contain a gas whose solubility into surrounding liquid is relatively high (e.g., $CO_2$ dissolving into $H_2O$) and increases as temperature drops. A rapidly collapsing bubble is one which is rapidly shrinking in size because internal condensable vapors are rapidly condensing and/or internal soluble gases are rapidly exiting the bubble to quickly dissolve into the surrounding liquid. The maximum potential energy of a thermally collapsible bubble is a function of its volume and pressure (e.g., P times V) and also includes contributions of additional potential energy due to possible vapor condensation, possible gas dissolution and surface energy of the bubble. When such a thermally collapsible bubble collapses rapidly, a substantial portion of its energy content is generally converted into other forms of energy such as energy of a generated sonic shockwave and/or heating the remaining bubble contents, possibly converting such contents into plasma, which plasma then radiates electromagnetically such as with light (e.g., sonoluminescence). Since in accordance with the present disclosure, thermally collapsible bubbles are formed of predefined limited sizes and are caused to collapse at correspondingly controlled levels of hydrostatic pressures and at controlled positions relative to the surface (e.g., spaced apart a predefined safe distance from the surface), the per-bubble kinetic energy (K.E.$\leq$P.E.) that may be coupled from a rapidly collapsing bubble to a nearby delicate surface feature of a to-be-treated workpiece can be controlled to be below a damage-inducing level. At the same time, the per-bubble K.E. that is coupled from a predominant portion of the rapidly collapsing bubbles near the delicate surface feature can be set to a sufficiently high level in many instances so as to provide treatment effective shockwave energy and/or radiative energy and/or other energies for purpose of surface preparation, surface ultracleaning and/or other wet treatment.

An example of an in-liquid thermally collapsing bubble is a water vapor bubble inside a cold water bath that is being heated to a boil, where the interior temperature of the bubble drops to below the water boiling point (B.P.) before the bubble reaches the top surface of the being-heated bath. This happens for example when a cold pot of water is initially heated to a boil from underneath and temperatures inside the pot have not yet equalized to be within about 1 to 5 degrees Celsius of one another. A rising and fast cooling bubble in such a case experiences rapid vapor condensation, resulting in the internal pressure drop and size contraction. The bubble collapses and essentially disappears before it reaches the top of the bath's liquid/air interface. The bubble may nonetheless emit sound at the end of its collapse process. Cooks sometimes hear a slight rumble just before their pots of boiling water erupt into viewable bubbles bursting at the top. A water bubble that merely bursts as it reaches the top of a boiling pot of thermally equilibrated water is not an in-liquid thermally collapsing bubble but rather just a liquid-exiting and bursting bubble that is disgorging its internal vapors into the atmosphere. While water vapor is the more often referred to example herein of a rapidly condensable vapor, it is fully within the contemplation of the present disclosure to employ other types of rapidly condensable vapors which may form bubbles in a liquid including bubbles formed of mixtures of vapors (e.g., water-alcohol(s) vapor mixtures; water-ketone(s) vapor mixtures, water-ether mixtures) and vapors of various organic compounds or mixtures thereof and multi-bubble complexes (e.g., $CCl_4$ bubbles aggregated on the outer surface of a water vapor bubble). The liquid layer in which the bubbles form and/or collapse may include ionic or non-ionic surfactants (e.g., ammonia) and/or other useful chemicals.

As mentioned above, a second kind of usable bubble in accordance with the present disclosure is a reactive-chemical delivering bubble, (b). The reactive-chemical delivering bubble is one that delivers a reactive chemical to, or close to a to-be-treated surface of a supplied workpiece where the delivered reactive chemical is one that can react chemically with a material on the to-be-treated surface. An example might be ozone ($O_3$) if the surrounding liquid is water. Typically, the surface material that will be reacted with is an unwanted impurity or unwanted particulate that is to be selectively removed from the to-be-treated surface. The delivered reactive chemical (e.g., $O_3$) may be one that is either slightly soluble or highly soluble in the surrounding liquid and it may be intermixed inside its bubble with a thermally collapsible (condensable) vapor. For example, a reactive-chemical delivering bubble in a water bath may be filled about 12.5% volumetrically with $O_3$ and about 87.5% volumetrically with $H_2O$ vapor. This bubble does not generally collapse fully to an essentially zero size due to presence of the noncondensable $O_3$ and as a result, the bubble also qualifies as being called a partially collapsible bubble in this case. After the about 87.5% volume-occupying amount of water vapor condenses, due to the cubic relation between volume and radius, the diameter of the remnant $O_3$ bubble will be roughly 50% of its original size (05.×05.×0.5=0.125) before effects of hydrostatic momentum are considered. When the condensable-into liquid vapor (e.g., $H_2O$) condenses rapidly at a predefined location relative to a workpiece surface, the to-be-delivered reactive chemical (e.g., $O_3$) which may not simultaneously condense, or condense as rapidly, is typically forced out of the partially collapsing bubble and into the locally surrounding volume of bath liquid due to the momentum of inrushing liquid that surrounds the partially collapsing bubble. Since in accordance with the present disclosure, reactive-chemical delivering bubbles are formed of sizes not generally exceeding a predefined limited size for such payload-delivering bubbles and these are formed at correspondingly controlled formation depths (and hydrostatic pressures), the per-bubble amount of reactive chemical that may be delivered from a corresponding collapsing, partially collapsing, or noncollapsing type of payload-delivering bubble to a nearby delicate surface locale of a to-be-treated workpiece can be controlled to be below a damage-inducing level and yet the delivered payload quantity and/or local concentration of the reactive-chemical payload can be at sufficiently high levels (and optionally accompanied by non-damaging but effective agitating forces) so as to provide treatment effective reactivity for purpose of surface preparation, surface cleaning and/or other wet treatment. Additionally, an advantage of reactive-chemical delivering bubbles is that they encapsulate and deliver their payloads to, or very close to a desired location of reaction. This may be contrasted with reactive chemical baths where large quantities of the reactive chemical are dispersed into non-useful regions of the bath volume and are thereafter flushed away as drainage without ever having done any useful work.

As mentioned above, a third kind of usable bubble in accordance with the present disclosure is a not-fully-collapsible surface sweeping bubble, (c). The not-fully-collapsible surface sweeping bubble is one that does not fully collapse into an essentially zero size before it reaches a to-be-treated surface of a supplied workpiece. An example of such a bubble might be a nitrogen ($N_2$) filled bubble in the case where the surrounding liquid is water. Typically, when not-fully-collapsible surface sweeping bubbles are used, the to-be-treated surface is a flat one (substantially planar) and it is tilted at a non-horizontal angle or is even close to vertical relative to gravity so that the not-fully-collapsible bubbles sweep up along and contact the to-be-treated surface as these bubbles rise toward the bath's top surface for ultimate bursting at that surface. The not-fully-collapsible bubbles may contain one or more relatively inert and non-condensable/non-soluble gases such argon (Ar) and/or nitrogen ($N_2$). As the not-fully-collapsible surface sweeping bubble sweeps along the to-be-treated surface, the bubble tends to pick up unwanted and pre-loosened surface debris. The rising bubble floats the unwanted debris away from the treated surface. Loosening of the pre-loosened surface debris may have been provided for by a priori subjecting the surface to collapsing bubbles. Although the not-fully-collapsible surface sweeping bubbles generally contain a non-soluble gas or a non-condensable vapor relative to the bulk liquid that surrounds the bubble, the not-fully-collapsible bubbles may nonetheless also contain thermally collapsible vapors and/or soluble gases that cause the bubble to partially collapse and to thereby eject its innards towards a nearby cool surface (towards the to-be-treated surface) due to temperature gradient and nano-jet effects as shall be explained below. Since in accordance with the present disclosure, not-fully-collapsible surface sweeping bubbles are formed of predefined limited size at correspondingly controlled formation depths, the per-bubble amount of surface bombardment energy that may be delivered from a corresponding not-fully-collapsing or noncollapsing sweep bubble to a nearby delicate face of a treated workpiece can be controlled to be below a damage-inducing level. At the same time, the delivered quantity of debris removing floatation forces provided by the not-fully-collapsing bubbles can be at a sufficiently high level (and optionally accompanied by non-damaging but effective agitating forces) so as to provide treatment effective floatation for purpose of surface preparation and/or cleaning.

Although each of the three above specified types of bubbles have been described as being launched individually towards interaction with a work surface, namely, the (a) thermally collapsible bubbles; (b) reactive-chemical delivering bubbles; or (c) not-fully-collapsible surface sweeping bubbles; it is within the contemplation of the present disclosure to launch mixtures of such bubbles sequentially towards interaction with a work surface region. For example, a reactive-chemical delivering bubble may arrive first and may be quickly followed by a thermally collapsing bubble so that collapse energies of the latter bubble interact with the delivered payload (e.g., $O_3$) of the reactive-chemical delivering bubble. The sequence may alternatively be the other way where the collapsing bubble arrives first, rapidly collapses near the surface location and then a reactive-chemical delivering bubble arrives shortly thereafter to chemically interact with the surface location after that surface location or fluid touching it has been agitated by the collapsing bubble. Additionally, the sequence of type (a) and (b) bubbles may be shortly followed by a type (c) bubble that sweeps the treated surface and float away any loosened debris or contaminants that may have been selectively dislodged from the workpiece by the interactions of one or both of the type (a) and (b) bubbles. Thus it is seen that combinations of the different kinds of in-liquid bubbles may be applied to in combination produce a desired effect (e.g., dislodging and sweeping away undesired particulate matter).

Although a main focus herein is on dislodging and sweeping away undesired particulate matter from a workpiece, it is within the contemplation of the disclosure to use in-liquid bubbles for the opposite purpose as well, namely, for purposefully causing particulate matter to attach to and bind with a target. The target could be a micropore filter provided for example inside a wet treatment bath, where thermally directed or density directed bubbles are used to direct contaminated fluid flows toward and/or through the filter so as to thereby cause contaminants therein to lodge inside the filter. The contaminated fluid flows could be ones that constitute after-flows flowing away from a being-cleaned workpiece.

In one wet treatment process in accordance with the disclosure, a to-be-treated work face of a supplied workpiece is held horizontally or at a tilt angle relative to rising bubbles in a wet treatment bath where the bubbles are limited to predefined per-bubble volume limits and thus to limited per-bubble energies and/or limited per-bubble payload sizes. These rising bubbles may include at least one of the above described: (a) thermally collapsible bubbles; (b) reactive-chemical delivering bubbles and (c) not-fully-collapsible surface sweeping bubbles.

In the case where the rising in-liquid bubbles contain thermally collapsible vapors and/or highly soluble gases, a temperature gradient producing means is provided and/or activated so as to maintain a substantial temperature difference along a bubble rise path within the bath. In other words, rather than allowing temperatures inside the bath to naturally equilibrate to being within just a few degrees of each other (e.g., 1-5 degrees Celsius), the temperature gradient producing means artificially causes a substantial temperature difference of cold-above-hot orientation (e.g., a cooler region that is cooler by greater than about 5 degrees Celsius relative to an underlying hotter region) to be maintained along the bubble rise path. The sustained and substantial temperature difference is such that a given location along the rise path of the bubbles; and near the to-be-treated work face, corresponds to the boiling point (B.P.) of a predefined condensable vapor in the thermally collapsible bubbles. For example, in the case of rising water vapor bubbles, the workpiece may be actively cooled to about 90° C. while a bubbles-generating heating element below the workpiece may be actively heated to about 110° C. so that somewhere in the sustained cold-above-hot temperature gradient zone that develops between the elements there will be a location whose temperature corresponds to the B.P. of the predefined condensable vapor (e.g., about 100° C.). By adjusting one or both of the high and low temperature levels created by the temperature gradient producing means and/or by adjusting the distance between the high and low temperature sustaining elements, the location of rapid bubble collapse may be adjusted. The location of rapid bubble collapse may be set so as to occur at one or more prescribed distances away from a to-be-treated work face. The setting of this prescribed location for rapid bubble collapse is another way that the deliverable energies (e.g., kinetic energies or K.E.'s) delivered by the bubbles to the work face can be controlled so as to not deliver excessive and thus damaging energies to delicate to-be-treated work face features.

In one embodiment, the temperature gradient producing means includes an active cooling element immersed in the bath. The active cooling element may include a heat exchange through which a cooling fluid is actively pumped so as to thereby sustainably maintain a desired low temperature. In one embodiment, the temperature gradient producing means may further include an active heating element immersed in the bath. The active heating element may include a heat exchange through which a heating fluid is actively pumped and/or an electrical heating element through which a controlled amount of electrical current is pumped. These examples of active cooling and active heating elements are nonlimiting. Active heating may alternatively or additionally be provided, for example, with use of lasers and/or application of microwave energy. (For example water vapor bubbles may be heated with a microwave field while the water vapor bubbles rises within an inorganic nonpolar liquid medium.) Sustainable cooling may include a supplying of ice chips to a heat conductor that connects to the workpiece or to an in-bath location very near to the workpiece so as to effectively cool the workpiece.

In one embodiment, the rising in-liquid bubbles of limited volumes are included in thermally upwelling flows of ultra-clean (substantially impurity free and/or contaminant free) cleaning/purifying liquids. After an ultra-clean upwell interacts with a to-be-cleaned/treated surface location and the fluid of the upwell thus potentially becomes contaminated by selectively removed debris and/or other unwanted matter removed from the treated surface location, the fluid after-flow is convectively directed away from the work face so as to thereby move the contaminants or debris, if any, away from the work face and to thus prevent re-deposition of such contaminants or debris onto the work face.

In one embodiment, a workpiece having a to-be-cleaned work face is immersed and positioned with the surface-to-be-cleaned down in a wet cleaning bath in which at least one of said (a) thermally collapsible bubbles; (b) reactive-chemical delivering bubbles and (c) not-fully-collapsible surface sweeping bubbles are to be generated. The work face is sustainably cooled to a first predetermined temperature (T1), typically well below a predefined boiling point of a pre-defined in-bubble condensable vapor) by direct contact of the workpiece with an active cooling means or by positioning of the active cooling means (e.g., a heat exchange through which cooling fluid is pumped) near the workpiece (e.g., above the workpiece). An active heating device is positioned a predefined distance below the workpiece face and operated at a substantially higher second temperature (T2, typically above the predefined boiling point of the predefined condensable in-bubble vapor). As a result of the actively maintained temperature gradient that has its cool point on top and comparatively much hotter point below, a hot upwell of uncontaminated cleaning fluid(s) is induced to flow from the hot zone towards the actively cooled workface. The hot zone and cool zone temperatures are adjusted and/or the distance between them is adjusted and/or the position of the workface along the actively maintained temperature gradient is adjusted so that thermal inducement of collapse of thermally collapsible bubbles in the upwell (if any) is caused to occur at one or more prescribed distances away from the workface. The rate of bubble collapse may also be controlled by adjusting the rate at which temperature drops versus distance and/or the rate at which bubbles rise (versus time) along the thermally graded rise path of the bubbles.

In one embodiment, thermally collapsible bubbles are launched from an actively heated, upwell-causing and bubble-launching zone that operates above the boiling point of a vapor that will be contained inside the thermally collapsible bubbles (e.g., water vapor). The upwell/bubble-launching zone is positioned lower within the liquid bath volume than the work face. As a result of fluid density differences between actively cooled liquid higher up in the bath and the actively heated fluid lower down in the bath, the denser, cooler liquid sinks and thereby forces the less dense, hotter fluid to rise due to displacement (a phenomenon also known as buoyancy). The displacement-driven hot upwell of substantially uncontaminated cleaning/purifying liquid(s)—which upwell typically also contains collapsible bubbles—rises along a fluid flow trajectory that carries its not-yet-contaminated cleaning fluid(s) and oft-included collapsible bubbles towards the to-be-cleaned face of the supplied workpiece. The rate at which the upwell rises (where the upwell can be in the form of a rising sheet or curtain of liquid and/or one or more bubble types in the above recited categories) towards the cooled workface can be a function of per-bubble volume, number of bubbles generated per unit time, viscosity of surrounding liquid and temperature difference between the actively maintained hot and cold zones in the bath. As such numerous control variables are provided for adjustment and optimization of the surface cleaning/treating process.

When a full or partial rapid bubble collapse occurs along the bubble rise path, the collapse event can produce localized agitation or shock waves of magnitude-limited levels near the to-be-cleaned surface. Optionally, the collapsing bubbles can generate nano-jets of liquid where these nano-jets self-orient themselves towards the cooled and to-be-cleaned/treated surface of the workpiece. The magnitude of the collapsing bubble shock waves and/or of the nano-jets and their proximity to the work surface can be adjustably controlled by various mechanisms including that of: (1) controlling the initial size (e.g., volume) of a bubble as it is launched towards the work face; (2) controlling hydrostatic pressure (P) near the zone of bubble collapse; (3) adjusting the temperatures of one or both of the high temperature (T2) upwell/bubble-launch zone and that of the cooled workpiece (T1) as well as (4) controlling the upwell/bubble drift distance provided in between T2 and T1. The chemical composition of the fluid(s) that form the insides of the bubble and/or surround the collapsing bubbles can be controlled by various mechanisms including that of pre-injecting condensable vapors and/or highly soluble gases into the interiors of the bubbles as the bubbles are formed and launched towards the face down work surface. The deliverable kinetic energy (K.E.) of each of the collapsible bubbles can be controlled by various mechanisms including that of adjusting initial bubble size (bubble volume) at the bubble launch zone, adjusting hydrostatic pressure ($P_{coll}$) at the bubble collapse location. As such numerous control variables are provided for adjustment and optimization of the surface cleaning/treating process so as to avoid damaging delicate surfaces while still providing treatment effective energies and/or payloads to the to-be-treated surface locations.

A cleaning method in accordance with the present disclosure comprises: (a) forming and launching an in-liquid collapsible bubble of predefined limited volume at a first depth within a cleaning bath; (b) causing the collapsible bubble to rise up along a trajectory that includes zones of sequentially decreasing temperature and to thereby cause the bubble to begin shrinking due to external temperature reduction; and (c) providing a face down and to-be-treated work surface immersed in the bath at or near a point of final rapid collapse of the shrinking bubble so that shock waves and/or nano-jets emitted by the rapidly collapsing bubble may be controllably delivered to the work surface in a treatment effective but non-damaging way. The surface cleaning/treating method may further comprise: (d) adjusting a thermal gradient present along said rise trajectory of the bubble where the thermal gradient has the decreasing temperature zones; (e) adjusting a launch temperature present at a launch location where the collapsible bubble first forms and/or launches into the cleaning bath; (f) adjusting hydrostatic pressure at the bubble launch location; (g) adjusting hydrostatic pressure at the bubble collapse location; (h) adjusting variable parameters of a bubble generating and/or shaping device such as adjusting heater surface roughness in the case of a simple heating wire; and (i) adjusting a chemical composition of the bubble as it nears its point of final collapse and/or as the bubble launches into the bath.

A wet treatment apparatus in accordance with the present disclosure comprises: (a) a tank for containing a bath of one or more treatment liquids; (b) a temperature gradient producing device that operatively couples to the bath for sustainably maintaining in the bath one or more temperature graded zones each having sequential regions of substantially decreasing temperatures wherein for a given zone, a relatively high temperature region is at a bottom of the given temperature graded zone and a substantially colder temperature region is at a top of the given zone; (c) a bubble launching device for launching thermally collapsible bubbles into a bottom of at least one of the temperature graded zones; and (d) a workpiece holder for holding a workpiece in the bath so that a to-be-treated surface of the workpiece is acted on by the thermally collapsible bubbles.

Other aspects of the disclosure will become apparent from the below detailed description.

BRIEF DESCRIPTION OF THE DRAWINGS

The below detailed description section makes reference to the accompanying drawings, in which:

FIG. 2A is a cross sectional view of a cleaning tank having an array of multiple upwell/bubble-launching zones in accordance with the disclosure; and FIG. 2B is a cross sectional view of an embodiment of the cleaning tank of FIG. 2A taken through sectional lines BB-BB.

DETAILED DESCRIPTION

Figure 1A:
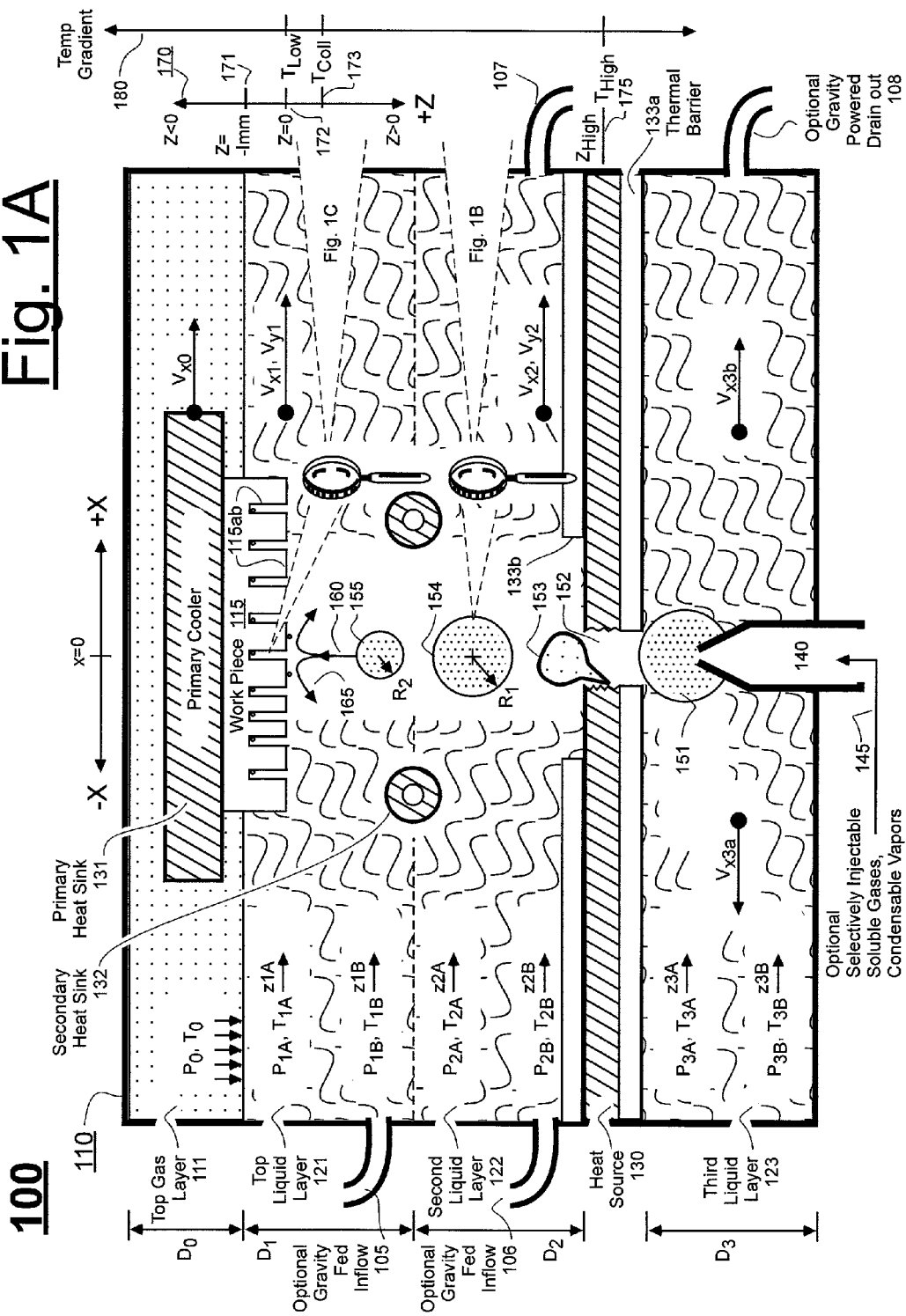
FIG. 1A is a conceptual side cross sectional view of a cleaning tank in accordance with the disclosure where collapsible bubbles may be launched and delivered in a controlled manner to a face-down workpiece.

FIG. 1A is a conceptual cross sectional diagram of a wet cleaning system 100 in accordance with the disclosure. Some parts are not illustrated or may be shown rotated 90 degrees to their actual position so as to better relate certain concepts, as will become clearer below. Also, various features shown in FIG. 1A are not necessarily to scale.

In terms of general context, a supplied workpiece 115 is shown to be immersed face down in a liquid cleaning bath 121-122 and held by a moveable chuck 131 that is also referred to herein as a primary cooler 131. The workpiece 115 itself can be a finely patterned and/or thin film coated semiconductor wafer (e.g., one having a monocrystalline silicon substrate as part of its monolithic structure) where fabrication of the wafer is currently in-process and thus not fully completed. Alternatively, the workpiece can be another device or manufacture requiring delicate and ultra-pure cleaning and/or other surface treatment. It is to be understood that in the typical case, the illustrated workpiece 115 has already been subjected to one or more, basic soft cleaning or purifying rinses as may have been appropriate, where the earlier wet rinses selectively removed easily removable ones of unwanted particulate matter (e.g., post-process debris) or impurities from the downwardly oriented face 115ab of the workpiece. However, at this stage of cleaning or other surface treatment, some amount of left over unwanted impurities and/or unwanted particulate matter may still remain (e.g., see particle Qx7 of FIG. 1C) attached (loosely or strongly) to the work face and it is desirable to now provide an ultracleaning and/or purifying process that will selectively remove at least some of the left behind, more difficult to remove, but still unwanted matter without adding new unwanted particulate matter or unwanted impurities to the workpiece's face-down surface (to work face 115ab) and without significantly damaging or otherwise altering desirable features present on the work face 115ab. Examples of desirable features that are to be left intact may include one or more of a thin surface film (not shown, but could be just hundreds or tens of Angstroms thick), a plurality of closely spaced projections (e.g., hardened photoresist lines) and/or a plurality of grooves or trenches having relatively high aspect ratios (e.g., 5:1, 10:1, 20:1 or greater). The small dots shown in FIG. 1A as being attached to work face 115ab represent unwanted matter that is to be selectively removed without damaging the work face. As indicated above, the matter that is to be selectively and safely removed may include a distribution of unwanted impurities in addition to or in place of unwanted particulate matter.

As further shown in FIG. 1A, there is provided an open top, or preferably a closed-top container (tank) 110 that supports a volume of one or more cleaning or treatment liquids therein. The interior of the container 110 may be lined with Teflon™ or another nonstick and low friction material. The interior liner of the tank should be one that does not easily shed debris or contaminants into the treatment liquids held inside the tank. The outside of the tank may be made of appropriate rigid and fluid containerizing materials including metals and/or ceramics.

Typically there will be only one bulk cleaning liquid in the tank 110 such as deionized, outgassed and highly purified water ($H_2O$) where this bulk cleaning/treatment liquid forms the major constituent of the illustrated liquid layers 121, 122 and 123. However, for purpose of greater generality, FIG. 1A shows the tank 110 as possibly containing a plurality of different liquid layers denoted as 121, 122 and 123 and having respective layer thicknesses D1, D2 and D3. FIG. 1A shows the tank 110 as possibly also containing a controllably pressurized gas layer 111 provided above the uppermost liquid layer 121.

In one embodiment, the topmost liquid layer 121 may be primarily composed of an organic solvent of relatively low density (e.g., $CCl_4$) while the middle liquid layer 122 is primarily composed of a higher density liquid such as an aqueous solution. In this latter case (with the organic liquid on top) it is to be understood that the interiors of fully-collapsible bubbles (e.g., 154' of FIG. 1B) discussed below are limited to essentially consisting of one or both of gases that are highly soluble in the interface liquid (e.g., 121) that interfaces with the to-be-treated surface 115ab of the supplied workpiece 115 and rapidly condensable vapors whose condensates are highly miscible in the interface liquid (e.g., 121) that interfaces with the to-be-cleaned surface. In one embodiment, the workpiece interfacing liquid (e.g., 121) is a supercritical liquid that is maintained near its triple point.

In one embodiment the workpiece 115 may be variably moved up or down (in the illustrated –Z and +Z directions respectively) under computer control so that its to-be-cleaned surface at different times interfaces for example with the middle liquid layer 122 rather than with the top liquid layer 121 or vise versa. In the case where the middle liquid layer 122 serves as the workpiece interface layer, the upper liquid layer 121 may serve as a barrier that impedes chemical constituents present in the pressurized gas layer 111 from diffusing down in substantial concentrations to a to-be-described critical depth 173 ($Z_{coll}$) where rapid bubble collapse is intended to occur.

In one embodiment, the chuck-held workpiece 115 may also be controllably moved (e.g., by computer automated control) laterally in the X and/or Y directions or rotated angularly in the XY plane and or tilted by rotation in the XZ plane. Such movements of the workpiece 115 may be carried out continuously or in steps by its holding chuck (a.k.a. the primary cooler 131) and by mechanical transport mechanisms thereof which are not shown for purpose of avoiding illustrative clutter. It is to be understood that the transport/rotation mechanisms as well as the workpiece holding chuck 131 should be constructed of an ultraclean structure and compositions and designed so as to be to avoid depositing of undesirable debris or impurities into the ultra-clean cleaning/treatment liquids used inside the tank 110. The ultra-clean (essentially uncontaminated) cleaning liquids 121-123 may be supplied from gravity driven holding tanks (not shown) as will be discussed in further detail below.

The gas layer 111 above the topmost liquid layer 121 may consist essentially of an inert or chemically inactive gas (e.g., argon and/or $N_2$) that is not miscible in the topmost liquid layer. However, in an alternate embodiment, the gas layer 111 may be saturated with vapors of the topmost liquid layer 121 and in some cases the upper gas layer 111 may contain chemicals that are to desirably dissolve into the topmost liquid layer 121 for purpose of assisting in the cleaning/treatment process. Alternatively or additionally, as mentioned, the topmost liquid layer 121 may serve as a barrier that blocks or inhibits certain unwanted materials from penetrating in excessive concentrations from the gas layer 111 to a predefined depth 173 of rapid bubble collapse. In one embodiment, the gas layer 111 is actively and persistently cooled to a predefined temperature, $T_0$ that is substantially below a boiling point (B.P.) of a pre-identified vapor (e.g., water vapor at pressure level $P_0$).

The topmost liquid layer 121 may be composed primary of $H_2O$ or of an aqueous liquid, or of a non-aqueous organic liquid or of an emulsion of both as deemed appropriate for the cleaning/treatment task at hand. More importantly, the upper gas layer 111 may be pressurized to a predefined pressure level $P_0$ so as to thereby define progressively higher hydrostatic pressure levels $P_{1A}$, $P_{1B}$, $P_{2A}$, $P_{2B}$, etc. that develop deeper in the tank 110 as a result of gravity. The base pressure level $P_0$ at the interface between gas layer 111 and top liquid layer 121 may be one atmosphere (1 Atm) for example or higher or lower as deemed appropriate for controlling collapsible bubbles (e.g., 154) that are to be formed (e.g., 153) at a predefined bubble-launch depth Z2b in the tank and initially surrounded by a corresponding hydrostatic pressure level $P_{2B}$ at the point (152) of launch as well as by a controlled surrounding temperature $T_{2B}$. As mentioned above, each of the bubble launch pressure (P) and bubble launch volume (V) may be constrained to predefined maximum values so as to thereby limit the potential energy (e.g., P*V) of launched bubbles and to thus assure that essentially all bubbles do not have an excessive potential energy (P.E.) that can damage a delicate work face 115ab of the supplied workpiece when that P.E. is converted to other forms of energy (e.g., kinetic energies).

Also as mentioned above, in one embodiment, temperature (T1) at the primary cooler 131 is caused to be substantially lower than the primary launch point temperature, $T_{2B}$. As a result, an upwelling flux 160 of fluid is induced to move from the location (depth $Z_{2B}$) of the upwell/bubble-launch zone 152 towards the surface 115ab of the workpiece. This occurs because warm fluid tends to be less dense than cold fluid and therefore gravity urges the heavier, denser cold fluid to move down and to displace the warmer, less dense and thus lighter fluid upwardly. This phenomenon is sometimes referred to as buoyancy. While the common sense tendency is to think of the warm and/or less dense blob of fluid as the one that is rising, the physical reality is that the cooler and/or denser blob of fluid is competitively descending and displacing its less dense competitor in the race for the bottom. (This latter explanation may help readers to better understand FIG. 2A in which heat shields like 233d appear to be facing the wrong way.)

Still referring to FIG. 1A, in order to increase the rate at which the upwelling liquid flux 160 rises, collapsing bubbles 153-155 are preferably generated at, and launched into the upwell 160 from an upwell/bubble-launch zone such as 152. These collapsing bubbles 153-155 are to be distinguished from conventional non-collapsible gas bubbles composed of insoluble gases and/or non-condensable vapors. However, before delving into details regarding what constitutes a collapsible bubble (e.g., 153-155, and also 156-156" of FIGS. 1C-1D), it may be useful to look at a bigger picture of what is intended to occur in cleaning tank 110. The upwelling flux 160 is to be composed of a cleaning/treatment fluid that is substantially uncontaminated by unwanted impurities and unwanted particulate matter, where the unwanted impurities and/or unwanted particulate matter is defined as matter which should not be deposited or re-deposited onto the to-be-treated work face 115ab. The upwelling flux 160 is to rise towards the to-be-treated surface 115ab without aid of conventional in-tank mechanical pumps or the like so as to interact with the face-down surface 115ab of the supplied workpiece. Conventional in-tank mechanical pumps tend to produce unwanted debris do to friction between moving parts. This debris then finds its way into the tank's liquid. In one embodiment, the upwelling clean fluid 160 is to interact with the work face 115ab so as to selectively dislocate unwanted particulate matter (e.g., Qx7, Qx8 of FIG. 1C) and/or unwanted impurities from that surface 115ab, and so as to then move the dislodged or absorbed matter away from surface 115ab and towards a debris/impurity removing flux or after-flow 165 (e.g., a convective flux) that carries the dislocated matter yet further away from work surface 115ab. The direction of flow of the debris/impurity removing after-flow 165 may be convectively controlled by the provision of a secondary active heat sink 132 that is laterally spaced apart from the initial upwell 160 of uncontaminated cleaning/treatment fluid. In one embodiment, the secondary heat sink 132 is in the form of a metal pipe having a cooling fluid of automatically controlled temperature flowing through its center. It is to be understood here that when controlled temperatures are discussed, or when controlled pressures, controlled mass flows and the like are discussed, it is within the contemplation of the disclosure to include appropriate sensors positioned in the system 100 for measuring respective ones of the to-be-controlled temperatures, pressures, mass flows and the like. Further, it is within the contemplation of the disclosure to provide computer controllable actuating means (e.g., electrical heaters, valves, etc.) for controlling the respective temperatures, pressures, mass flows and the like. Further, it is within the contemplation of the disclosure to provide one or more automatic feedback control units and/or control computers operatively coupled to the sensors and the actuators for maintaining desired system levels. Accordingly, the temperatures of the primary and secondary heat sinks, 131, 132, may be controlled and maintained by one or a combination of cooling fluids flowing at desired cooling temperatures and they may be further controlled by electrical heaters disposed therein for fine tuning of the temperatures of the primary and secondary heat sinks, 131, 132. Similarly the temperature of an in-tank primary heat source such as 130 may be controlled by one or a combination of pumped-through heat exchange fluids (not shown) flowing at a desired heating temperature through a center hollow (not shown) of the heat source 130 and/or one or more electrical heaters that are driven for fine tuning of the local temperatures induced by the primary heater 130. While not shown, heating may be provided by other controllable means such as lasers or injected microwave energies.

Also, as will become clearer shortly, mass flows of essentially uncontaminated cleaning/treatment-fluids entering via inlet tubes such as 105, 106 and mass flows of contaminated cleaning-fluids exiting via drainage tubes such as 107, 108 may be similarly controlled with flow control actuators designed to prevent introduction of additional debris into the cleaning tank 100.

In order to assure that the initial upwell 160 of cleaning fluid(s) is essentially uncontaminated by unwanted matter, it may be desirable to have one or more very slow drifts of fresh and essentially uncontaminated cleaning/treatment fluids moving into the tank 110 (e.g., via feed tube 105) and to have potentially contaminated liquids slowly draining out of the tank 110 (e.g., via drain tube 108) so that the workpiece 115 is not re-contaminated with debris or impurities removed from it or removed from another nearby (not shown) other workpiece that is also being cleaned or was just cleaned in tank 110. The slow drifts of fresh incoming cleaning fluids (e.g., from feed tube 106) and of the out-draining contaminated fluids (e.g., via drain tube 108) should be arranged so as to avoid generation of turbulent fluid fluxes in the volumetric region where upwell 160 and bubbles 154-156 rise up to meet with and interact in a controlled way with the work surface 115ab.

In one embodiment, in order to prevent formation of turbulent fluid flows, the combination of the primary active cooler (chuck) 131 and workpiece 115 move slowly and in unison laterally in the +X direction at a slow velocity, $+V_{x0}$ (e.g., less than about an inch per minute) so that different parts of the work surface 115ab will be sequentially exposed to the rising flux 160 of surface cleaning/treatment fluid(s) and/or to the rising flow of bubbles 153-155 as the workpiece 115 advances relative to the upwell/bubble-launch zone 152. In order to avoid formation of turbulent fluxes around the moving workpiece 115, the top liquid layer 121 may be optionally slowly advanced at a matching velocity, $+V_{X1}$ so as to minimize velocity differentials in the region where the rising flux 160 of cleaning fluid(s and bubbles) interact with the work face 115ab, thus creating a situation substantially equivalent to that of the workpiece 115 and surrounding top liquid 121 being stationary and the heat source 130 and secondary coolers 132 moving relative to the hypothetically stationary parts. In this way, only the thermally upwelling flux 160 of cleaning/treatment fluid(s) is moving upwardly (in what is defined herein as a minus Z direction—because that direction comports with dropping temperature—) toward the face down workpiece 115. In an alternate embodiment, liquid velocity $+V_{X1}$ is zero and stepwise advancement of workpiece 115 is periodically stopped prior to each of periodic bubble treatment runs.

Although externally induced turbulences are to be avoided at the region where fluid upwell 160 meets with the to-be-treated surface 115ab, and thus velocity $+V_{x0}$ should substantially match with velocity $+V_{x1}$ (even if both are zero for a predefined time duration while cleaning occurs), it may still be acceptable to allow for nonzero liquid flow differentials or flows in other directions in other areas of top liquid layer 121 that are spaced substantially away from where the uncontaminated upwell 160 meets with the workpiece 115. For example, liquid flow in other directions, such as represented by flow vector $V_{y1}$, may be provided for removing impurity/debris contaminated fluid out of the tank 110. In one embodiment, an optional gravity-fed inflow via tube 105 supplies a first fresh flow of cleaning/treatment fluid from a first ultra-filtered storage tank (not shown) that is positioned higher up relative to tank 110 where that first refreshing and essentially uncontaminated inflow (105) deposits into a lower level (e.g., z1B) of liquid layer 121 so as to continuously refresh the top liquid layer 121 with uncontaminated and ultra-filtered cleaning/treatment fluid that can then thermally upwell into contact with work face 115ab. At another part of the tank, one of more gravity-powered drainage tubes to such as 107 and 108 may be provided for slowly draining out debris/impurity contaminated cleaning/treatment fluids from the tank 110. The rate of drainage outflow is carefully controlled to match the rate of inflow so that the bulk liquid (121-123) in tank 110 appears to be essentially static. In the case where liquid layers 121 and 122 are composed of different liquid materials (e.g., organic versus aqueous; or different concentrations of solutes), separate gravity feed tubes at different levels (e.g., z1B, z2B) such as shown at 105 and 106, may be provided for supplying the differently composed refreshing liquids of the different liquid layers 121-122 at their respective depths and mass flow rates. As mentioned above, in one embodiment liquid layer 121 may be a less dense organic composition (or an emulsification of organic and aqueous liquids) whereas liquid 122 may be a denser aqueous solution. Alternatively, both of top liquid layer and middle liquid layer 122 may be composed of just one of an organic liquid or an aqueous liquid or an emulsification of liquids, where the concentrations of various cleaning-facilitating additives included into each of the liquid layers (if at all) may vary if desired so as to create concentration gradients of such additives for interaction with the collapsible bubbles (153-156) that rise up through the different liquid layers, 121-122.

While not fully shown in FIG. 1A, the bottom liquid layer 123 may have additional drainage tubes like 108 positioned at laterally opposed ends of the tank (or evenly distributed all around the tank) so as to induce symmetrical drainage velocities $V_{x3a}$ and $V_{x3b}$ that move debris/impurity contaminated liquid of that lower layer 123 away from the bubbles origination point 152 of the upward thermal upwell 160. The third liquid layer 123 may communicate with the top or middle liquid layers, 121 and 122, by way of thermally insulated openings or tubes (not shown) provided through the high temperature heating layer 130 where these communication passageways are provided in regions spaced away from where the thermal upwell 160 of fresh cleaning/treatment fluid(s) occurs. These communication passageways (not shown) to lower layer 123 may be used to move impurity/debris-contaminated liquid fluxes (e.g., 165) toward the bottom drainage tubes 108. Such communication passageways are not shown in order to avoid confusing illustrative clutter.

Still referring to FIG. 1A, the focus here is first and foremost on what happens to thermally collapsible bubbles such as 154 and 155 that rise up along the trajectory of thermal upwell 160 and interact with the work surface 115ab of the supplied workpiece 115. (In one embodiment, the in-liquid collapsible bubbles may be caused to collapse slowly into essentially zero size before they reach work face 115ab rather than collapsing rapidly near work surface 115ab.) It is to be understood that workpiece 115 may be just one of a plurality of to-be-treated workpieces that are introduced sequentially into cleaning tank 110, one after the next for the purpose of being subjected to one or more fluid upwells like 160 and/or rising bubbles contained within such thermal upwells. In addition to thermal upwells like 160 it is within the contemplation of the disclosure to subject a workpiece to not-fully-collapsible surface sweeping bubbles in some cases. Noncollapsible bubbles rise due to displacement by denser surrounding liquid even if there is no thermal upwell.

Different workpieces 115 may have different types of whettable surfaces with different affinities (e.g., hydrophobic or hydrophilic) toward whetting by organic/inorganic and/or polar/non-polar liquids or mixed combinations of both. As such it may be necessary to change the interface liquid layer (e.g., 121) within which bubble collapse occurs from being a hydrophilic one (an aqueous one) to being a hydrophobic one (an organic one), or an emulsified one depending on what type of work surface 115ab is to interface with the interface liquid layer (e.g., 121) and is to be cleaned and/or otherwise treated within tank 110.

It is to be noted that a graded temperature zone or gradient 180 of decreasing temperatures is established between the high temperature, upwell/bubble-launch region 152 and the region of the cooled surface 115ab of the workpiece. For purpose of reference, the vertical depth of a major portion of work surface 115ab will be referenced as being immersed or located at depth Z=0 and the corresponding temperature along gradient 180 for Z=0 will be denoted as being equal $T_{Low}$ or $T_0$. Unlike convention, here the positive Z direction heads deeper into the tank. At the depth of the upwell/bubble-launch mechanism 130, the vertical location is denoted as $Z_{High}$ (and also as 175). A relatively high temperature, $T_{High}$ occurs at $Z_{High}$ (175) as a result of local heating action provided for example by an electrically heated metal plate or an electrically heated metal wire 130. Plate or wire 130 is disposed between ceramic insulation regions 133a and 133b. In one embodiment, regions 133a and 133b include alumina. An opening of predetermined size and shape is defined in the upper ceramic region 133b so as to expose thermally conductive metal in the upwell/bubble-launch zone 152. The exposed metal is roughened to a predetermined surface roughness. The combination of opening size, opening shape and exposed metal roughness can control rate of bubbles generation and can control the maximum volume of each launched bubble. Numerous other techniques may be used for controlling number of bubbles generated per minute, maximum volume of each launched bubble and maximum pressure of each launched bubble. By way of nonlimiting example, bubble size might be variably controlled with the use of electrically bimorph plates (not shown) that nonfrictionally define a bubble escape width between them.

After launch, collapsible ones of launched bubbles will begin to shrink due to temperature reduction and/or dissipation of soluble innards. Between the depths Z=0 (172) and Z=$Z_{High}$ (175) there will be a depth 173 referred to here as $Z_{collapse}$ (see FIG. 1C) where a corresponding temperature of rapid bubble collapse, $T_{collapse}$ occurs for thermally collapsible bubbles. Collapse occurs rapidly at this temperature ($T_{collapse}$) because a boiling point (B.P.) of a bubble-interior major vapor is crossed, because interior pressure within the collapsible bubble then decreases at an exponential rate even as outside temperature for the rising bubble drops for example at a linear rate versus time or versus distance traveled by the rising bubble. The physical distance between Z=0 and Z=$Z_{High}$ may be adjusted if desired by, for example moving the workpiece (or its chuck 131) vertically up or down or positioning the upwell/bubble-launching heat source 130 higher or lower within the tank 110. Accordingly, not only can the temperature difference between $T_{Low}$ and $T_{High}$ be adjusted, the rate of temperature change over distance (dT/dZ) may be adjusted by changing either one or both of the heating temperature of heat source 130 and the cooling temperature of primary cooler 131 as well as optionally changing the distance between heat source 130 and primary cooler 131. Also, the rate of temperature change versus time (dT/dt) may be adjusted by changing the bubble rise rate and/or the rate of temperature change over distance (dT/dZ).

In one embodiment, the primary cooler 131 includes an active heat exchange (not shown, see instead 231 of FIG. 2A) such as one formed of tubes that carry a fluid coolant (e.g., $N_2$) pumped through them. The workpiece 115 is attached with good thermal contact to the primary heat sink 131 and therefore the workpiece 115 acquires a temperature ($T_{Low}$) equal to, or close to that (T1) of the primary cooler 131. The primary cooler 131 functions to persistently and sustainably remove heat energy from the tank 110 and to thus artificially maintain the substantial temperature gradient 180 between Z=0 and Z=$Z_{High}$ where the artificially maintained temperature gradient includes a temperature corresponding to the boiling point (B.P.) of a predetermined condensable vapor (e.g., water vapor) that forms a major interior constituent within at least one of the thermally collapsible bubbles rising in the tank 110.

In one embodiment, the heat source 130 is in the form of a metal wire, a metal strip or a thin film metal plate (e.g., one that is clad to a ceramic substrate) where the exposed outside of the wire, strip or plate is composed of a relatively nonreactive metal such as platinum or palladium or tantalum or another such chemically inert noble metal that is capable of conducting heat fairly well. Nonreactivity is determined in this case relative to the surrounding liquid 122. The heat source 130 is generally thermally insulated by a thermal insulating barrier 133a-133b such as one composed of alumina or another appropriate ceramic except in predefined places such as that of the illustrated upwell/bubble-launch zone 152 where the heat-transfer metal is relatively exposed (could be exposed through a thin barrier layer). In one embodiment, exposure of the heater metal is provided by continuous longitudinal slits or by periodically interrupted slits or circular openings defined in the upper ceramic portion 133b. In one embodiment each slit or circular opening has a width in a range from about 10 microns to about 500 microns. In one embodiment the ceramic insulating layer(s) 133a, 133b include a porous ceramic of a kind obtainable, for example from Meta Material Partners of Columbus, Ohio 43212. The specific ceramic composition may vary from application to application based on what type of liquid defines layer 122 and what types of thermal gradients are to be established and/or what types of chemicals if any are to be allowed to permeate through the porous ceramic material 133a, 133b.

As mentioned, the exposed metal surface of the upwell/bubble-launch zone 152 may be roughened to a predefined degree of surface roughness so as to encourage generation of thermally collapsible bubbles 153 at desired rates (e.g., number of launched bubbles per minute) and/or with desired maximum initial diameters (e.g., $2*R_1$). If desired, before a thermally energized, nascent bubble 153 detaches from its heated bubble-launch zone 130, the interior of that nascent bubble 153 may be infused with selectively injectable soluble gases or condensable vapors 145 by means of injector 140. Many different methods may be used for generating nascent bubbles 153 and/or infusing their interiors, if desired, with different soluble gases or condensable vapors 145. Moreover, if the launched bubble is to be only partially collapsible, its interior may be further filled with predetermined proportions of relatively insoluble gases (e.g., $O_3$ if the interface liquid is $H_2O$) or noncondensable vapors. As such, specific methods for generating fully thermally collapsible bubbles or partially thermally collapsible bubbles will not be detailed to a great extent. Examples of different bubble generating techniques include: (1) local vaporization of the surrounding liquid (122) at the heater element, (2) injection of super-heated vapor (for example and without limitation, water vapor at a temperature in a range from about 100° C. to about 200° C.) from an external reservoir and through nozzles into a lower liquid layer (e.g., into 123); (3) laser-induced, super-heating of a liquid interface plate; (4) microwave-induced super-heating, and so forth.

As mentioned above, although water vapor is the more often referred to example herein of a rapidly condensable vapor, other types of rapidly condensable vapors which may form bubbles in a liquid may be used including mixtures of vapors such as water-alcohol(s) vapor mixtures. Included among these are water mixed in a treatment-effective proportion with ethanol and/or methanol and/or propanol and/or isopropyl alcohol. The other types of rapidly condensable vapors which may form bubbles in a liquid may include treatment-effective mixtures of water and one or more ketones including for example acetone. Various other examples of easily vaporizable organic solvents may be mixed with water vapor or other vapors to form the bubble interiors where the mixed vapors are selected for application specific functions (e.g., surface cleaning of surfaces with pre-identified contaminants or impurities).

Referring to detached bubble 154—which bubble is understood to be the same as nascent bubble 153 after the latter detaches from its bubble-launch zone 152—this just-launched bubble 154 has a first, relatively large radius $R_1$ when it first detaches from its point of formation 152. As the thermally collapsible bubble 154 rises generally in the −Z direction, it also moves in the negative temperature change direction from the high temperature region, $T_{High}$ (at depth 175) towards the low temperature region, $T_{Low}$ at depth Z=0. In one embodiment, $T_{LOW}$ is well below the boiling point (B.P.) of a predefined vapor but not so low as to be below the freezing point of the top liquid layer 121 (e.g., about 0° C. for water) for example no lower than 5° C.; while $T_{High}$ is at, above or is pulsed to be above the at-depth-and-pressure boiling point of the top liquid 121 (e.g., about 100° C. for water) for example 125° C. Note that the top pressure $P_{1A}$ of the top liquid 121 may be greater than 1 Atm if the $P_0$ of the gas layer 111 is raised above 1 Atm. In one example, $T_{LOW}$ can be set to be just a handful or more degrees below the boiling point (B.P.) of a bubble interior vapor (e.g., about 100° C. for water) for example at about 90° C.-95° C.

Released bubble 154 begins to rise due to buoyancy. However, since the temperature of the liquid surrounding bubble 154 decreases as the bubble 154 rises towards work surface 115ab, the bubble 154 begins to shrink in radius as is indicated for example by the next stage of the same bubble shown at 155 with a reduced radius, $R_2$.

Figure 1B:
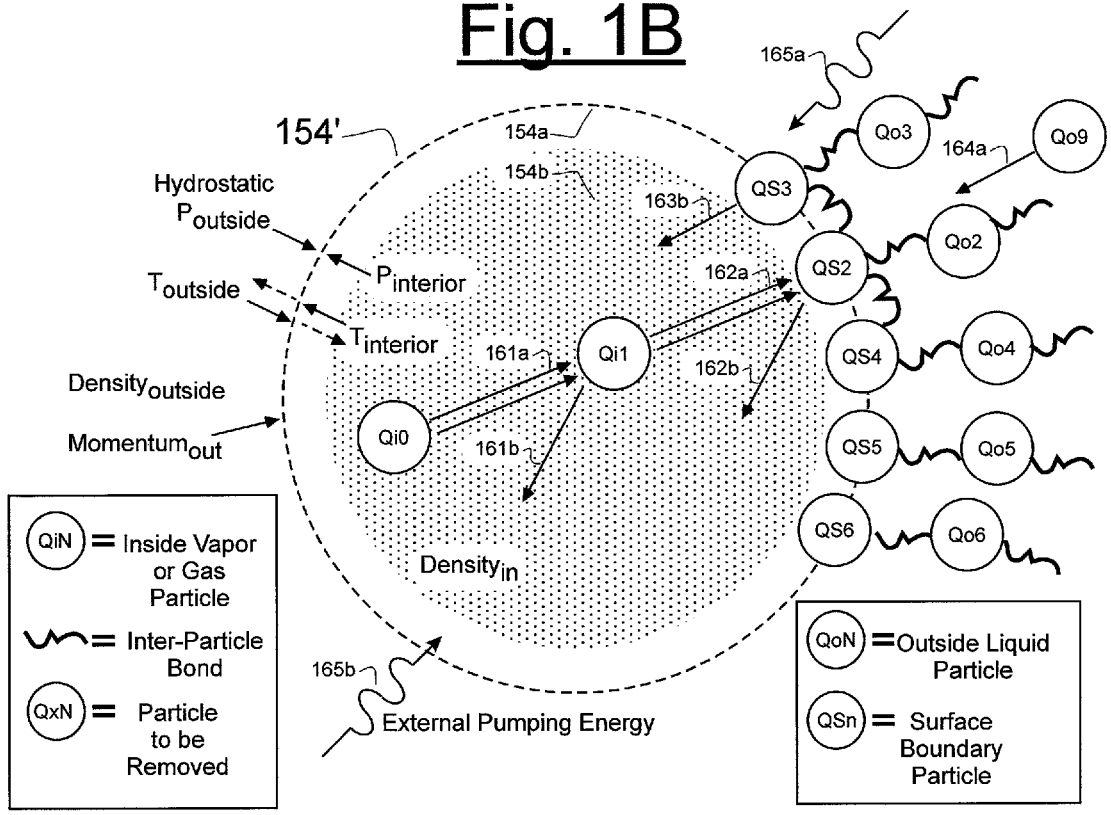
FIG. 1B is a schematic diagram for explaining the dynamics and morphology of a collapsing bubble.

Referring to FIG. 1B the dynamics and morphology of a collapsing bubble 154' are explored here in greater detail. The bubble 154' has a surface or outer skin 154a that generally tends toward a spherical shape when the bubble 154 is surrounded by a relatively symmetric ambient situation (no sharp rigid boundaries nearby). The bubble 154' has an interior 154b that is sparsely filled with energetic interior particles denoted as QiN. (These interior particles may be atoms or molecules or agglomerations of molecules that are sufficiently small to be deemed to constitute a gas or a vapor phase.) Thus the density of the interior of the bubble 154' is generally much smaller than the density of the surrounding liquid (Density$_{outside}$). As already mentioned, in order for the bubble 154' to be a thermally collapsible one, its interior should include a substantial amount of at least one rapidly thermally condensable vapor. The bubble collapses as the condensable vapor rapidly condenses and joins with the surrounding liquid. More specifically, when a first internal particle Qi0 interacts (represented by arrow 161a) with a second internal particle Qi1, then depending on internal temperatures and energies, the interacting internal particles may join to, and form a condensed combination with each other, or the colliding internal particles Qi0 and Qi1 may bounce apart (which interaction is represented by arrow 161b) and thus not yet condense. At relatively high temperatures (those close to $T_{High}$) the interior particles will tend toward bouncing apart from each other (161b) whereas at relatively low temperatures (those closer to $T_{collapse}$) they will begin to condense and thus move rapidly out of the vapor phase and towards the liquid phase.

Additionally, internal particles within the bubble 154' may collide (e.g. 162a) with surface boundary particles QSn of the bubble with similar join-or-bounce-apart results depending on temperature, relative energies, reactivities and/or solubility factors. If the bubble's internal temperature is relatively high, an internal particle, e.g., Qi1, which collides with a surface boundary particle e.g., QS2 may simply bounce away (162b) with slightly decreased energy. Alternatively, a surface-contacting internal particle e.g., Qi1 may join with and dissolve into the exterior liquid mass QoN residing outside the bubble boundary 154a. The bubble 154' thus begins to shrink in size as energy and/or mass is dissipated to the outside. Bubble size may be increased by pumping 165a,b additional energy into its interior (e.g., from a laser or microwave source) but generally such positive insertion of energy occurs only at the bubble-launch zone 152 while the nascent bubble 153 is operatively coupled to the heat source (or to another energy source).

The surface boundary particles (QSn) of bubble 154' are generally unique in that their inter-particle bonds are asymmetrically organized so as to bond tightly to the liquid particles positioned outside the bubble while being non-bonded or dangling at positions facing inwardly into the rarified interior of the bubble 154'. This asymmetrical condition at the surface boundary is associated with the surface energy of the bubble. Due to surface energy effects, the surface boundary 154a may attract (164a) to it and capture certain types of chemicals (e.g., Qo9) dissolved in the surrounding liquid medium. In other words, the bubble 154' may function as an attracting concentrator and floatation means for certain chemicals that are to be desirably delivered to the point of cleaning on the work surface 115ab of the workpiece 115. In view of this, the exterior liquid solution QoN may be intentionally doped with various ones of these desirable cleaning-facilitating molecules (e.g., Qo9) as deemed appropriate. Examples of cleaning-facilitating molecules that may be dissolved into an aqueous surrounding solution include, but are not limited to, ammonia ($NH_3$), hydrogen chloride (HCl), hydrogen fluoride (HF) and/or various surfactants and/or emulsifiers and/or alcohols as may be deemed appropriate. Some of these may be dissolved into the liquid layers 121-122 by being first introduced in gas or vapor form in the upper gas layer 111. Alternatively or additionally, one or more of such cleaning-facilitating molecules may be introduced into the liquid layers 121-122 by way of feed tubes 105-106. Alternatively or additionally, one or more of such cleaning-facilitating molecules may be introduced into the interior of the nascent bubble 153 by being injected into the area of formation as the bubble forms prior to detachment from the bubble-launch zone 152.

Still referring to FIG. 1B, the dynamics of a bubble such as 154' are such that internal temperature ($T_{interior}$) and the external ambient temperature ($T_{outside}$) quickly equalize so that $T_{interior}$ approximately equals $T_{outside}$ due to persistent collisions of bubble interior particles e.g., Qi1 with the surface boundary particles e.g., QS2. However, even as inside and outside temperatures slowly decrease in unison while the bubble 154' rises along a negative temperature gradient (e.g., 180 of FIG. 1A) the interior pressure ($P_{interior}$) of the bubble can drop much faster (e.g., exponentially relative to temperature reduction) than external pressure. Since the interior pressure ($P_{interior}$) operates to keep the bubble 154' expanded as against the compressive forces of the outside hydrostatic pressure ($P_{outside}$), when interior pressure ($P_{interior}$) does drop dramatically, say to being about ⅕th or about 1/10th or even a smaller fraction of the magnitude of the external pressure ($P_{outside}$), there is essentially no force to oppose the compressive forces of the outside hydrostatic pressure ($P_{outside}$) and the bubble 154' collapses very rapidly towards becoming a singularity. Such rapid collapse tends to occur at a critical temperature, $T_{coll}$ where interior particles QiN quickly change from the vapor phase to the liquid phase. Generally, $P_{interior}$ is an exponential function of outside temperature ($T_{outside}$) such that $P_{interior}$ decreases at a very large rate ($dP_{in}/dt$) rapidly even as $T_{outside}$ decreases at a substantially slower and usually linear rate ($dT_{out}/dt$) towards the critical collapse temperature, $T_{coll}$ due to rise of the bubble ($dZ/dt$). Location and speed of collapse can be controlled in the apparatus 100 of FIG. 1A by adjusting the magnitudes of one or both of $T_{LOW}$ and $T_{High}$ and/or by adjusting the separation distance between $Z_{Low}$ (172) and $Z_{High}$ (175) and/or by adjusting the base pressure $P_0$, and/or by adjusting the immersion depth, $+Z_{imm}$ (271) of the work face 115ab and thus changing the hydrostatic pressure at Z=0.

As mentioned above, rapid collapse of bubble 154' is generally accompanied by conversion of its potential energy into kinetic energy. In other words, rapid collapse of the bubble 154' implies more than just that the rarified interior 154b of the bubble disappears. As the internal pressure, $P_{interior}$ of the bubble 154' decreases rapidly, the external liquid masses (e.g. Qo3-Qo6) begin to accelerate towards a central part of the bubble and they acquire a particular energy of momentum (0.5*mv^2) as a result of this collapse initiated movement. The final collision between the inrushing liquid masses can be rather intense, and in some cases can heat remaining contents of the collapsing bubble to high temperatures can and convert the remaining contents into a plasma and thus create an emission of electromagnetic radiation at various wavelengths (e.g., light). The latter effect is known as sonoluminescence. Such radiation emission can be used to generate chemical radicals in the surrounding liquid (e.g., $O^-$, $Cl^-$, $F^-$, $H^+$, etc.) depending on the surrounding molecules (e.g., $O_3$, HCl, HF, $NH_3$, etc.) in the vicinity where the radiation is released. These radiation-created radicals may be useful for facilitating certain surface cleaning or other treatment functions in different applications. Additionally, localized heating of the internal contents of the collapsing bubble may induce a local chemical reaction. Additionally, the final collision between the inrushing liquid masses can generate a rebound shock wave of magnitude corresponding to the energy lost by the collapsed bubble where that shock wave may then agitate surrounding liquid and thus provide a cleaning-facilitating or other treatment-facilitating function.

Figure 1C:
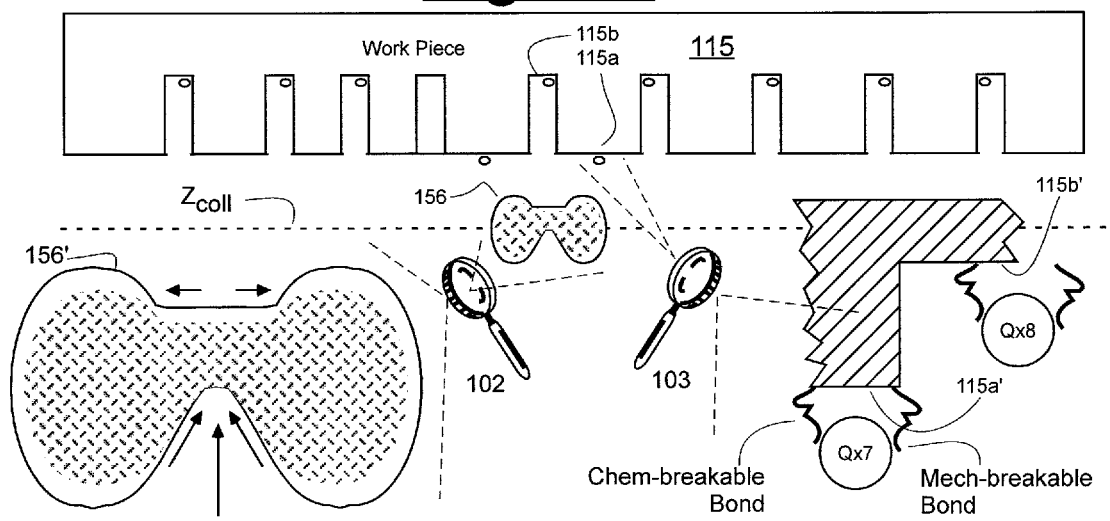
FIG. 1C is a schematic diagram showing two magnified regions near the to-be-cleaned workpiece surface, one of which is for explaining asymmetric deformation of a collapsing bubble if collapse occurs as the bubble nears a solid workpiece surface and the other is for explaining how bonding of undesired particles to the workpiece surface may be broken with one or both of mechanical agitation and chemical interaction.

Referring to FIG. 1C, if the temperature ($T_{coll}$) and hydrostatic pressure ($P_{coll}$) for this rapid collapse phenomenon is set to occur at a depth ($Z_{coll}$) which is a predefined distance away from but nonetheless fairly close to the rigid surface of a submersed object such as workpiece 115, then bubble collapse tends to occur in asymmetrical fashion as depicted at 156 and shown in magnified form at 156' per the illustrated magnifying glass symbol 102. Vertical movement of the liquid mass that surrounds the upper part of the collapsing bubble becomes constrained due to the presence of the adjacent rigid surface 115a or 115b. As a result of this constraint, liquid mass movement at the top of the bubble is forced to occur generally only in the lateral directions (roughly along the XY plane). On the other hand, vertical movement of the liquid masses on the underside of the bubble 156' is less constrained, and as a result, a vertically rising surge of liquid develops near the center of the underside of the collapsing and now kidney-shaped bubble 156'.

Figure 1D:
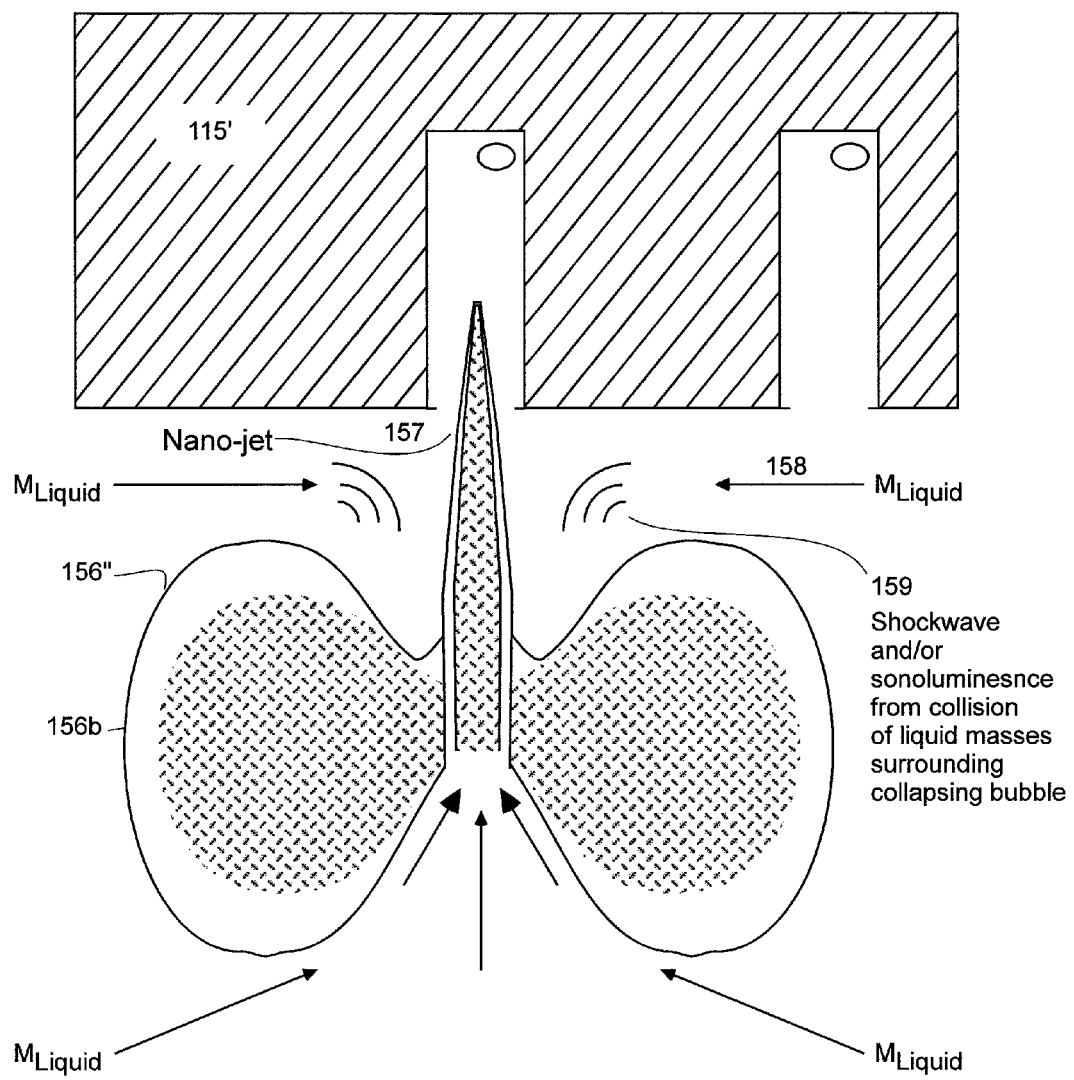
FIG. 1D is a schematic diagram showing in greater magnification, the formation of a self-aligning nano-jet as a rising bubble continues its asymmetric collapse at or near the cooled workpiece surface.

Referring to FIG. 1D, as this asymmetrical bubble collapse continues and the unopposed liquid mass from the bottom rises, a reentrant nano-jet 157 is formed heading in a direction towards the workpiece 115'. This nano-jet 157 generally contains the interior contents of the remnant bubble as well as those chemicals (e.g., Qo9) that were recently attracted to and floated up by the surface boundary 154a of the rising bubble. The nano-jet 157 can thus usefully deliver high concentrations of cleaning-facilitating chemicals to the site of an unwanted and bound surface particle or impurity (e.g., Qx7 of FIG. 1C) even if the particle/impurity (e.g., Qx8 of FIG. 1C) is located in the deep portions of a high aspect ratio trench (115$b'$). Additionally, since a shockwave 159 can be created as the laterally coalescing (158) masses of liquid ($M_{Liquid}$) meet from around the collapsing bubble 156", and/or the collapsing bubble 156" can give rise to sonoluminescent radiation, one or more of these various attributes of the collapsing bubble 156" can facilitate local cleaning or other local treatment functions by providing mechanical agitation to the surrounding liquid, by attracting desirable surfactants to the region or other treatment-facilitating chemicals to the to-be-treated surface 115$ab$ as well as generating additional chemical radicals for assisting in the desired removal of unwanted matter (e.g., debris).

Referring to the right portion of FIG. 1C, magnification 103 schematically shows examples of unwanted particulate matter, Qx7 and Qx8 that are respectively bonded to a lowest surface portion 115$a'$ and a highest surface portion 115$b'$ of work face 115$ab$ by way of one or more various bonding mechanisms. These bonding mechanisms may be ones that are preferentially breakable by mechanical agitation of surrounding liquid and/or these bonds may be ones that are preferentially breakable by electrostatic repulsion action such as that provided by surfactants delivered to the workpiece 115 by thermal upwell 160 and/or by the collapsible bubbles 153-156 provided therein. Because collapsing bubbles such as 156' of FIG. 1B can provide both a highly directed nano-jet 157 that is aimed at the work surface and/or shock waves 159 that are operatively proximate to the work surface, these proximate and directed forces may work in a highly effective way to provide appropriate mechanical bond breaking action and/or chemical bond breaking action for certain types of bonds that otherwise inhibit unwanted particulate matter, (e.g., Qx7 and Qx8) from being selectively removed by conventional wet rinses. Also because effective concentrations of cleaning-facilitating radicals and/or surfactants may be provided in the liquid surrounding the collapsing bubble 156", these concentrations of cleaning-facilitating chemicals may be highly effective in breaking loose the otherwise resistant bonds present between unwanted particles Qx7, Qx8 and the adjacent workpiece surfaces 115$a'$, 115$b'$ without damaging the work surface 115'. This is to be contrasted with the Megasonics approach where excessive and damaging effects may be created due to the uncontrolled wave reinforcement and wave interference phenomenon associated with high frequency sonic energies.

Referring to FIG. 2A, a cross sectional schematic view (not to scale) is shown of a second wet treatment system 200 which includes an array of plural upwell/bubble-launching sources, 230$a$, 230$b$ and 230$c$ disposed at different X and Z positions. Like reference symbols and numbers in the "200" century series are used for elements of FIG. 2A which correspond to but are not necessarily the same as the elements represented by similar symbols and reference numbers of the "100" series in FIG. 1A. As such, an introductory description of the elements found in FIG. 2A is omitted here. FIG. 2B shows one embodiment in cross section as taken along lines BB-BB of FIG. 2A.

In FIG. 2A, different ones of the plural upwell/bubble-launching sources, 230$a$, 230$b$ and 230$c$ may be operated in unison or selectively activated (e.g., by computer automated control) to operate at different times as a supplied workpiece 215 is advanced through the wet treatment tank 210. Various areas of the advanced workpiece 215 may thus be selectively treated in different ways or subjected to substantially same wet treatments. Although not explicitly shown, primary heat sink 231 may have selectively and independently heated and cooled sections for allowing selectable parts of workpiece 215 to be differentially heated or cooled in certain applications. As such the temperature along the work face 215$ab$ does not have to be uniform. Workpiece 215 may optionally rotate in the XY plane as it advances in the +X direction or repeats passage through the tank in the −X direction. Workpiece 215 may also optionally be rotated in the XZ plane at different times so as to change its tilt angle, so as to remove trapped noncondensible bubbles from its surface, so as to sweep its surface with noncondensible bubbles and/or so as to perform other desired operations.

In FIG. 2A, respective fresh flows 249$a$, 249$b$ and 249$c$ of essentially uncontaminated liquids flow upwardly from under respective heating structures 230$a$, 230$b$ and 230$c$. Each of these heating structures is surrounded by a respective, heat tolerating and thermally nonconductive sheath 233$a$, 233$b$ and 233$c$ made for example of an appropriate ceramic or other dielectric material. Each of sheaths 233$a$-233$c$ can have its respective formation of openings 252$a$, 252$b$ and 252$c$ directed in a respective predetermined direction and opened by a predetermined width. In the illustrated example, openings 252$a$, 252$b$ and 252$c$ open up in the directions at which their respective thermal upwells, 260$a$, 260$b$ and 260$c$ will rise. The initial volumes and initial hydrostatic pressures of the bubbles (e.g. 253$a$, 253$c$) launched therefrom may be controlled by the sizes and shapes of their respective sheath openings 252$a$-252$c$, by the respective depth ($Z_{2a}$, $Z_{2b}$, $Z_{2c}$) of the bubble-generating surfaces 252$a$-252$c$ and the respective temperatures at which these bubble launch surfaces are operated ($T_{2a}$, $T_{2b}$, $T_{2c}$). As such different bubbles of different limited volumetric sizes and internal pressures may be generated for interacting in different ways with the workpiece 215 that passes over them. Incidentally although FIG. 2A shows a single gravity fed inflow 205 supplying same fresh liquids into upflow tubelets 249$a$, 249$b$ and 249$c$ through a common supply tube, it is within the contemplation of the disclosure to have separate and independently fed and controlled feeds; 249$a$, 249$b$ and 249$c$, of respective different chemicals for each of the heating elements 230$a$-230$c$. Additionally, various gases or liquids may be fed into a heating structure such as 230$c$ for mixing with the upflowing local fresh liquid 249$c$. For example, a longitudinal through-hole 234$c$ may be defined at the bottom of heating wire 230$c$. A gas or liquid that is permeable through ceramic sheath 233$c$ may be fed through this longitudinal through-hole 234$c$ for permeating through ceramic sheath 233$c$ and thereafter mixing into and infusing into the generated bubbles 253$c$ that are formed as part of thermal upflow 260$c$. When the so-generated bubbles 255$c$ rapidly collapse at a higher elevation (e.g., 273), the chemicals infused into that bubbles 255$c$ may be ejected by way of nano-jets or other mechanisms for interaction with the passing by areas of workpiece surface 215$ab$.

As further shown in FIG. 2A, thermally insulative sheaths made of ceramic or another heat tolerant and heat conductivity resistive material (e.g., dielectrics) is provided partially around each of the secondary cooling tubes 232$a$-232$c$. It is to be recalled that convective downdrafts of liquid are formed when cooler denser liquid regions are generated and these denser liquid regions competitively displace less dense blobs of liquid below them. Accordingly, since it is desired to convectively direct the respective after-flows 265$a$, 265$b$ and 265$c$ of respective uncontaminated upwells 260$a$, 260$b$ and 260$c$ away from the workpiece surface 215$ab$ after the upwell has interacted with the work face 215$ab$, the openings of thermally nonconductive sheaths 233$d$, 233$c'$, 233$e$, 233$e'$, 233$f$ and 233$f'$ are directed away from the respective rise paths of thermal upflows 260a-260c. As a result of the active generation of cooler denser liquid regions at the exposed metal faces of cooling pipes 232a-232c', convective downdrafts are created thereat to pull potentially contaminated after-flows 265a-265c away from the uncontaminated upflows 260a-260c and preferably towards nearby provided drainage openings such as 208. The mass flow rates of drainage tubes like 208 and the mass inflow rates of feed tubes like 205 should be carefully controlled by automated computer means or otherwise so as to maintain constant the desired immersion depth 271 of the workpiece surface 215ab and so as to thereby control accurately the rise distances of the respective bubbles 255a-255c from their respective launching regions 252a-252c and to thereby accurately control the multiple temperature gradients 280 that are created between the actively cooled workpiece 215 and the actively heated bubble generating regions 252a-252c.

Referring to FIG. 2B, this is one possible cross section of the tank 210 of FIG. 2A where the cross section is taken through lines BB-BB of FIG. 2A. It is to be noted for example, that in another embodiment, secondary cooling tubes may instead extend longitudinally in the X direction while the heating lines extend longitudinally in the X direction. It is to be noted for example, that in another embodiment, heating and/or cooling lines may be supported by frames that are suspended into the tank from above rather than having the heating and/or cooling lines extend fixedly through the walls of the tank as shown in FIG. 2B. When heating and/or cooling lines are supported by frames (not shown) that are suspended into the tank from above, the frames may be adjustably reciprocated up or down (and/or tilted in the YZ plane and/or rotated in the XY plane) so as to thereby change the Z axis locations of the respective heating/cooling lines (and/or their directions of longitudinal extension). Additionally fresh fluid inlet tubes and after-flow drainage tubes (not shown in FIG. 2B) may also be suspended into the tank from above rather than being extended protrudingly through the tank wall. The positions of the suspended fresh fluid inlet tubes and after-flow drainage tubes in the tank may be similarly adjusted relative to the advancement path (e.g., $V_{x0}$) of the workpieces so as to obtain desired treatment effects. As such, there is no need for having a wet bath tank with holes punched through its sidewalls. Moreover, the tank can be open-topped and placed in a larger pressure chamber where the latter is pressurized to establish the upper atmosphere 211 and its base pressure $P_0$.

In FIG. 2B, the ceramic sheaths of the respective heating elements may function as electrical insulators for extending electrical connections to the respective, electrically heated elements out of the tank so that they may be driven by respective, computer-controlled signal generators 292 (e.g., variable current AC sources with optional deactivation switches). Similarly, the cooling fluid which flows though secondary coolers such as 232a" may be injected into the tank 210 by way of inlet tubes that extend out of the tank as shown in FIG. 2B and thereafter drained out from the tank by further outlet tubes that extend out of the tank at the other end as shown in FIG. 2B for respective example 232a". The cooling tubes are preferably fully sheathed by ceramic material at their extreme ends where they extend out of the tank so as to provide electrical insulation. In such cases, electrical heating may be provided by computer controlled signal generators such as 291 for fine tuning of the cooling temperature provided by the cooling fluids flowing through the secondary cooling elements. Tube 205' is understood to be a branch of the optional inflow inlet tubes 205 that are seen along cross sectional line BB-BB.

While specific methods for generating bubbles and controlling their maximum potential energies have been disclosed here, these are to be understood as nonlimiting examples. Bubbles may be generated by use of Venturi-based, bubble generators. Such Venturi-based bubble generators may operate on the basis of post-bottleneck pressure drop and of pressure recovery after some distance beyond the Venturi bottleneck. An initial bubble that is injected into a stream immediately after the bottleneck will start growing due to hydrostatic pressure drop, and when it gets to a location where the pressure starts to increase sharply, the expanded bubble will disintegrate into a multiplicity of smaller bubbles, thereby creating a bubble shower which, by itself, can provide an efficient method of surface treatment. However, in accordance with the present disclosure, an active heater is disposed upstream just prior to the bottleneck, and it heats the downstream flowing liquid to a temperature above that liquid's boiling point, at least by several degrees ° C. As a result, thermally collapsible vapor bubbles are generated. The vapor bubbles are picked up by the Venturi stream and moved to the post-bottleneck zone of sharp pressure increase, where these thermally collapsible bubbles disintegrate into a multiplicity of smaller thermally collapsible bubbles. As explained above, a thermally collapsible vapor bubble is different from a normal non-collapsible gas bubble because the thermally collapsible vapor bubble collapses quickly at a critical temperature due to vapor condensation. The lower the collapsing temperature is, the faster the collapsing time tends to be. Venturi-based bubble generating devices may be implemented as bubble shower-heads, or as blade-shaped bubble dispensers that dispense curtains of rising bubbles. Bubbles from such devices can scan across the work face of a passing above and face down wafer so as to provide close to 100% treatment coverage of the wafer surface.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

By way of extending example, it is understood that the configuring of an automatically controlled bubble tank (e.g., 200 of FIG. 2A) in accordance with the disclosure can include use of a computer (not shown) to carry out selective activation and control (e.g., 291, 292) of various heating and cooling elements (e.g., 230a, 231, 232a) and/or selective activation and control of various chemical inputting and drainage means (e.g., 205, 208, 234c of FIG. 2A). A computer-readable medium or another form of a software product or machine-instructing means (including but not limited to, a hard disk, a compact disk, a flash memory stick, a downloading of manufactured instructing signals over a network and/or like software defining means) may be used for instructing one or more instructable machines (e.g., computers) to carry out such selective activation and control functions. As such, it is within the scope of the disclosure to have an instructable machine carry out, and/to provide a software product adapted for causing an instructable machine to carry out a machine-implemented method comprising selective activation and/or control of various tank parameters including but not limited to: actively maintained heating temperatures, actively maintained cooling temperatures, actively maintained pressures, actively controlled device locations, actively controlled mass flow rates and so forth.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein. Descriptions above regarding related technologies are not admissions that the technologies or possible relations between them were appreciated by artisans of ordinary skill in the areas of endeavor to which the present disclosure most closely pertains.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C.§120 and/or 35 U.S.C.§251.

What is claimed is:

1. A wet treatment method for treating a to-be-treated and deformable or damageable work face of a supplied workpiece, the work face having been previously worked-on so as to have one or more pre-specified capabilities or functionalities defined by said previous working-on on the work face, the method comprising:

creating in a liquid containing tank containing one or more host liquids, a thermal gradient extending substantially vertically between first and second spaced apart locations of the one or more host liquids, wherein the created thermal gradient includes respective and successive first, second and third temperature zones having respective and successively increasing first, second and third temperatures as well as respective first, second and third pressures, at least one of the first and second temperatures being a critical temperature (Tcrit) at and below which a predetermined first and rapidly condensable vapor condenses when subject to the respective first or second pressure of the corresponding first or second temperature zone, the third temperature being greater than the critical temperature and being a temperature at which the first and rapidly condensable vapor does not rapidly condense when at the third pressure;

disposing the work face of the supplied workpiece at an exposure location between the first and second spaced apart locations or at the first location, the exposure location coinciding with or being above a respective location of the thermal gradient where the critical temperature (Tcrit) is present; and subjecting the work face of the supplied workpiece to a first upwelling flow of one or more of the host liquids, the first upwelling flow flowing up at least through the third temperature zone so as to encounter the one or the other of the first or second temperature zone having said critical temperature, wherein the first upwelling flow includes fully thermally collapsible bubbles or partially thermally collapsible bubbles that contain the first rapidly condensable vapor, wherein the fully thermally collapsible bubbles or partially thermally collapsible bubbles collapse as they rise with the first upwelling flow and encounter the temperature zone having said critical temperature, and wherein the deformable or damageable work face of the supplied workpiece is not functionally deformed or functionally damaged by exposure at its exposure location to energies unleashed by collapse of the fully thermally collapsible bubbles or partially thermally collapsible bubbles that rise with the first upwelling flow to encounter the temperature zone having said critical temperature, said functional deformation or functional damage being ones that, if either occurs, substantially degrades or destroys at least one of the pre-specified one or more capabilities or functionalities of the worked-on work face.

2. The wet treatment method of claim 1 wherein:

the first upwelling flow contains fully thermally collapsible bubbles whose locations of rapid collapse are thermally controlled so that such rapid collapse occurs at one or more prescribed distances away from the to-be-treated work face so as to thereby keep the deformable work face of the supplied workpiece from being damaged or permanently deformed by the collapse of the fully thermally collapsible bubbles.

3. The wet treatment method of claim 2 wherein:

a maximum deliverable energy deliverable by each fully thermally collapsible bubble to the work face from said prescribed distance away from the work face is limited so as to avoid permanent damage to or permanent deformation of predefined delicate features on the work face.

4. The wet treatment method of claim 3 wherein:

said maximum deliverable energy deliverable by each fully thermally collapsible bubble to the work face from said prescribed distance is sufficiently large to constitute treatment-assisting energy for measurably assisting in a predefined treatment being applied to the work face.

5. The wet treatment method of claim 1 and further comprising:

convectively directing an afterflow of the first upwelling flow away from the work face after the first upwelling flow how has interacted with the workpiece so as to thereby direct contaminants, if any, that entered the flow away from the work face.

6. The wet treatment method of claim 5 wherein:

said convective directing of the after-flow includes actively cooling at least one liquid region within said liquid containing tank, the actively cooling occurring at a position in the tank below the exposure location.

7. The wet treatment method of claim 1 wherein:
said creating of the thermal gradient includes actively cooling at least a portion of the workpiece.

8. The wet treatment method of claim 7 wherein:
said creating of the thermal gradient includes actively heating at least one liquid region within said liquid containing tank.

9. The wet treatment method of claim 8 wherein:
said active heating of at least one liquid region includes heating to a temperature above the second temperature.

10. The wet treatment method of claim 1 wherein:
said one or more host liquids include a cleaning fluid that can selectively remove a predefined contaminant from the work face with or without assistance of added kinetic energy.

11. The wet treatment method of claim 1 and further comprising:
subjecting the to-be-treated work face of the supplied workpiece to one or more additional upwelling flows of respective liquids where the one or more additional upwelling flows include at least one of:
thermally collapsing bubbles;
reactive-chemical delivering bubbles; and
non-collapsible surface sweeping bubbles.

12. The wet treatment method of claim 1,
wherein the to-be-treated work face of the supplied workpiece can have one or more unwanted and predefined particles of particulate matter or one or more unwanted and predefined impurities adhered thereto prior to being subjected to said wet treatment method, the adhered particles or impurities being ones that can substantially interfere with at least one of the pre-specified capabilities or functionalities of the work face, and
wherein the method includes keeping the first upwelling flow essentially free of the unwanted and predefined particulate matter and essentially free of the unwanted and predefined impurities so that the first upwelling flow essentially cannot supply the unwanted and predefined particulate matter and cannot supply the unwanted and predefined impurities to the work face of the supplied workpiece during the wet treatment.

13. The wet treatment method of claim 12, wherein said keeping the first upwelling flow essentially free of the predefined particulate matter and of the predefined impurities comprises:
providing an active heat sink that is laterally spaced apart from the first upwelling flow and is vertically below the work face.

14. The wet treatment method of claim 1,
wherein a reactive chemical is included in the fully thermally collapsible bubbles or partially thermally collapsible bubbles, the reactive chemical being one that can react chemically with a material on the to-be-treated work face.

15. The wet treatment method of claim 14,
wherein the reactive chemical is ozone.

16. The wet treatment method of claim 1,
wherein at least one of the one or more host liquids includes one or more of ionic or non-ionic surfactants.

17. The wet treatment method of claim 16,
wherein a gas is provided in the tank, above and in contact with at least one of the one or more host liquids contained by the tank, and
wherein treatment facilitating agents are included in at least one of the provided gas, or at least one of the one or more host liquids or the collapsible bubbles.

18. The wet treatment method of claim 17,
wherein the treatment facilitating agents are selected from the group consisting of:
ammonia ($NH_3$), hydrogen chloride (HCl), hydrogen fluoride (HF), a surfactant, an emulsifier and an alcohol.

19. The wet treatment method of claim 1 and further comprising:
injecting at least one of a condensable vapor and a soluble gas into an interior of at least one of the bubbles as the bubble is formed, where solubility is correspondingly with respect to a corresponding one or more of the host liquids.

20. The wet treatment method of claim 1,
wherein a first of the host liquids is an organic liquid having a respective first density and a second of the host liquids includes water and has a respective second density greater than the first density.

21. The wet treatment method of claim 1,
wherein the disposing of the work face includes keeping the work face in a substantially face down orientation relative to the first upwelling flow.

22. The wet treatment method of claim 21,
wherein the face down oriented work face includes at least one of vertically extending protrusions having sidewalls or depressions having interior surfaces,
wherein one or more unwanted and predefined particles of particulate matter or one or more unwanted and predefined impurities can adhere to the sidewalls of the protrusions if the latter are present or can adhere to the interior surfaces of the depressions if the latter are present, the adhered particles or impurities being ones that can substantially interfere with at least one of the pre-specified capabilities or functionalities of the work face, and
wherein the collapsing bubbles supply mechanical agitation to the adhered particles or impurities for thereby helping to dislodge the adhered particles or impurities from at least one of the protrusion sidewalls and the interior surfaces of the depressions.

* * * * *